United States Patent [19]
Fukumoto

[11] Patent Number: 5,753,953
[45] Date of Patent: May 19, 1998

[54] SEMICONDUCTOR STORAGE DEVICE AND METHOD OF DRIVING THE SAME

[75] Inventor: Takahiro Fukumoto, Nara, Japan

[73] Assignee: Matsushita Electronics Corporation, Osaka, Japan

[21] Appl. No.: 709,901

[22] Filed: Sep. 9, 1996

[30] Foreign Application Priority Data

Sep. 11, 1995  [JP]  Japan ................... 7-232951

[51] Int. Cl.$^6$ ................................. H01L 29/788
[52] U.S. Cl. ............................. 257/316; 257/315
[58] Field of Search ......................... 257/316, 315

[56] References Cited

U.S. PATENT DOCUMENTS

| 5,422,504 | 6/1995 | Chang et al. ............... 257/316 |
| 5,429,969 | 7/1995 | Chang ........................... 437/43 |

FOREIGN PATENT DOCUMENTS

| 0 597 585 | 5/1994 | European Pat. Off. . |
| 0 612 107 | 8/1994 | European Pat. Off. . |
| 5-110071 | 4/1993 | Japan . |
| 5-226662 | 9/1993 | Japan . |
| 2 291 537 | 1/1996 | United Kingdom . |
| 94-10706 | 5/1994 | WIPO . |

OTHER PUBLICATIONS

Patent Abstracts of Japan, vol. 17, No. 672 (E-1474), Dec. 10, 1993 of Japan Patent 5-226662, Matsushita Corp., Sept. 3, 1993.

*Primary Examiner*—Stephen Meier
*Attorney, Agent, or Firm*—McDermott, Will & Emery

[57] ABSTRACT

A drain region and a source region are formed in a silicon substrate, and a select gate is formed on the substrate between the source and drain regions with a gate insulating film sandwiched. On one side of the select gate, a floating-gate is formed out of a sidewall formed with an insulating film sandwiched. On the floating-gate and the select gate, a control gate is formed with an insulating film sandwiched. The insulating film directly below the floating-gate is formed as a tunnel oxide film which can allow FN tunneling of electrons. In an erase operation, electrons are injected into the floating-gate from the silicon substrate, and in a write operation, electrons are extracted from the floating-gate to the drain region. A current required for writing and erasing each cell can be decreased, a low power supply can be used, and the lifetime of the tunnel insulating film can be elongated. Thus, the invention provides a semiconductor storage device (EEPROM) which works as a nonvolatile memory capable of page erase and page write at a low supply voltage.

24 Claims, 26 Drawing Sheets

⟨WRITE (MODE1)⟩
(EXTRACTION)

⟨WRITE (MODE2)⟩
(EXTRACTION)

⟨ERASE (MODE1)⟩
(INJECTION)

⟨ERASE (MODE2)⟩
(INJECTION)

⟨WRITE (MODE1)⟩
(EXTRACTION)

⟨WRITE (MODE2)⟩
(EXTRACTION)

⟨ERASE (MODE1)⟩
(INJECTION)

⟨ERASE (MODE2)⟩
(INJECTION)

⟨ READ ⟩

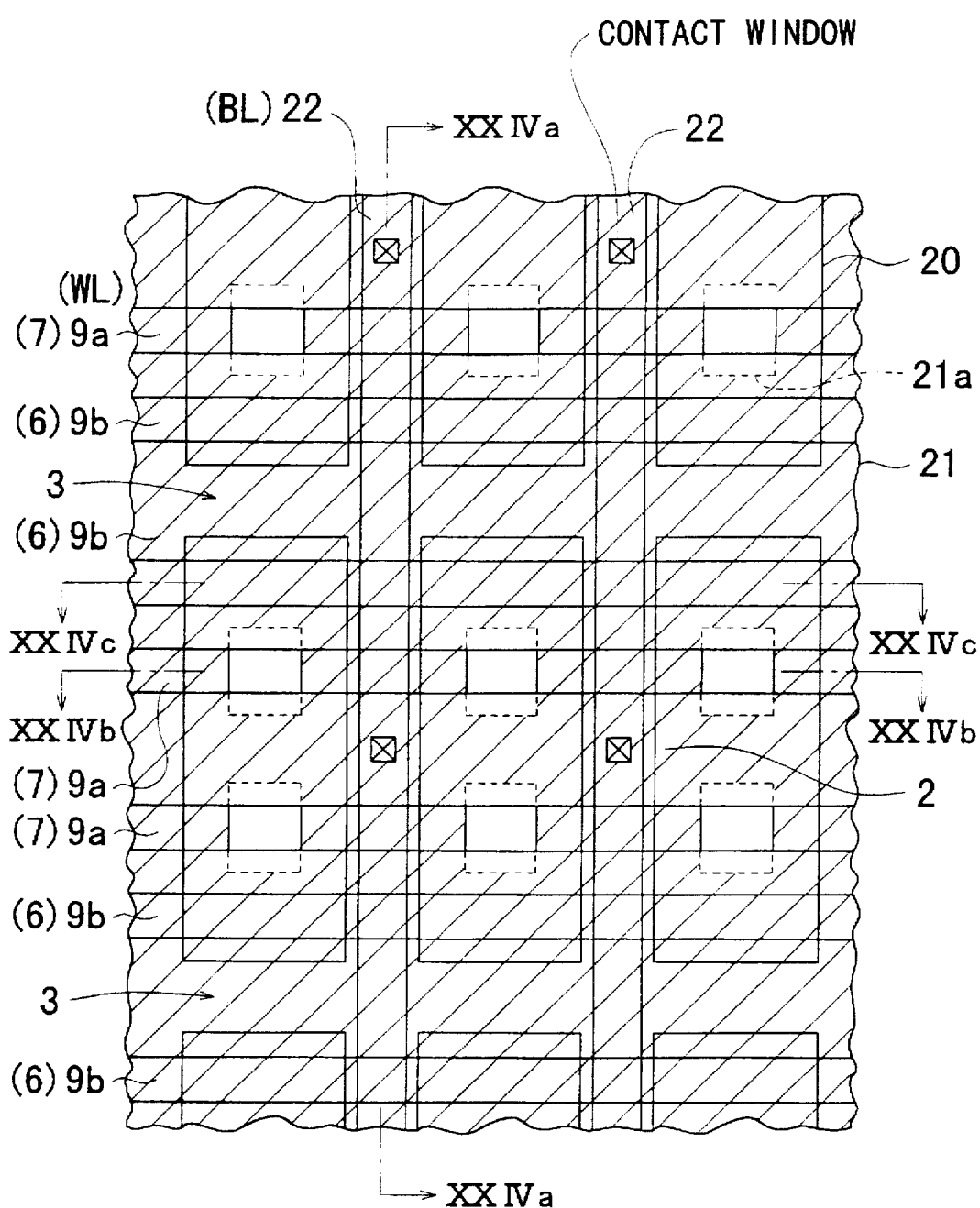

SEMICONDUCTOR STORAGE DEVICE AND METHOD OF DRIVING THE SAME

BACKGROUND OF THE INVENTION

The present invention relates to a method of driving a semiconductor storage device mounting nonvolatile memory cells each including a floating-gate type field effect transistor.

As a nonvolatile, writable and erasable memory, an EEPROM is already known. FIGS. 25(a) and 25(b) show the structure of a unit cell of a conventionally used typical EEPROM and the principles of erase (injection of a charge) and write (extraction of a charge) in this unit cell. The unit cell of the EEPROM is formed by connecting a memory transistor and a select transistor in series to each other. For example, an n-type impurity is introduced at a high concentration into an active area in a p-type semiconductor substrate 101, so as to form a drain region 102 of the select transistor, an n$^+$ region 103 serving as a source region of the select transistor and a drain region of the memory transistor, and a source region 104 of the memory transistor. On the semiconductor substrate 101, a select gate 107 of the select transistor is formed with an insulating film sandwiched, and a floating-gate 105 of the memory transistor is also formed. On the floating-gate 105, a control gate 106 of the memory transistor is formed with an insulating film sandwiched. Between a part of the n$^+$ region 103 serving as the drain region of the memory transistor and the floating-gate 105 is disposed a tunnel oxide film 110 having a particularly small thickness.

As is shown in FIG. 25(a), in injecting electrons into the floating-gate 105, a low voltage of 0 V is applied to the drain region 102 of the select transistor and a high voltage of 20 V is applied to the select gate 107 and the control gate 106. As a result, the select transistor is turned on so that electrons flow from the drain region 102 to the n$^+$ region 103, and then, the electrons are injected into the floating-gate 105 through the tunnel oxide film 110 due to the FN tunneling.

As is shown in FIG. 25(b), in extracting electrons from the floating-gate 105, a low voltage of 0 V is applied to the control gate 106, and a high voltage of 20 V is applied to the select gate 107 and the drain region 102 of the select transistor. As a result, the electrons in the floating-gate 105 are extracted through the tunnel oxide film 110 to the n$^+$ region 103, and then flow into the drain region 102 of the select transistor.

In this conventional EEPROM, write and erase operations are conducted by making use of movement of electrons between the drain region of the memory transistor and the gate electrode caused by the FN tunneling. The state where electrons have been injected into the floating-gate 105 can be arbitrary defined as an erased state or a written state and is not systematically defined.

On the other hand, another type of EEPROMs utilizing a principle for a write operation different from that described above is also proposed.

For example, the present inventors have proposed a storage device as is shown in FIG. 26 in which electrons are injected from a source side (See Japanese Laid-Open Patent Publication No. 5-226662). In the structure of FIG. 26, a floating-gate 202 and a select gate 203 are formed on a p-type silicon substrate 200 with a gate insulating film 201 of a silicon oxide film having a thickness of approximately 10 nm sandwiched. An insulating film 204 of a silicon oxide film is formed between the gates 202 and 203 and on the side surfaces thereof. On the gates 202 and 203, a control gate electrode 208 of a polysilicon film is formed with an ONO (oxide-nitride-oxide) multilayered insulating film, including an oxide film, a nitride film and another oxide film, sandwiched. Furthermore, a drain region 205 and a source region 206, that is, impurity diffused layers, are formed in the p-type silicon substrate 200 on both sides of the pair of the gates 202 and 203.

In adopting this structure, when the control gate 208 is set at a high positive voltage of approximately 12 through 17 V and the select gate 203 is set at a low positive voltage of approximately 1 through 2 V in injecting electrons into the floating-gate 202, a weak inversion layer is formed below the select gate 203 and a depletion layer is formed in the substrate below the floating-gate 202. That is to say, a large potential gap is generated between the inversion layer below the edge, which is close to the source region, of the floating-gate 202 and the depletion layer adjacent to the inversion layer. By making use of this potential gap, electrons can be injected into the floating-gate 202. When this technique is used, the EEPROM can attain a refined structure in which the select transistor and the memory transistor are mounted at a high density. In addition, although the drain voltage is comparatively low (5 V in this case), the write operation can be conducted at a higher speed than in the conventional EEPROM.

In the semiconductor storage device of FIG. 26, however, the electron injection from the source side into the floating-gate has the following problems:

First, in the injection from the source side, the write operation can be conducted at a comparative low drain voltage (of approximately 5 V). However, when a 3 V system supply voltage is used, a memory cell is required to have a function that a write operation can be sufficiently conducted at a drain voltage of approximately 2 V, in consideration of the fluctuation in the threshold value of the transistor and temperature compensation. Therefore, it is difficult to inject electrons by using a single power supply system of lower than 3 V.

This problem seems to be overcome by increasing the drain voltage alone so as to exceed the supply voltage. However, an injection current in adopting the injection from the source side is approximately 10 μA, which is remarkably smaller than a current of mA order in adopting the most general channel hot electron injection, but there is a limit in the number of memory cells into which electrons can be injected at a time.

In addition, it has been found that the electron injection from the source side can degrade a peculiar memory function, although the cause of the degradation has not been sufficiently probed. Accordingly, the number of repeating times of write/erase cycles is limited to only scores of thousands.

SUMMARY OF THE INVENTION

The present invention was devised in view of the aforementioned problems, and the object is, in a semiconductor storage device mounting nonvolatile memory cells each including a floating-gate type transistor and a method of driving the same, improving the number of erasing and writing times and improving the reliability, while decreasing a supply voltage required for write and erase.

The fundamental semiconductor storage device of this invention comprises at least one memory cell mounted on a semiconductor substrate, and the memory cell includes a first diffused layer and a second diffused layer of a second conductivity type formed in an area of a first conductivity type in the semiconductor substrate with a space between the first diffused layer and the second diffused layer; a floating-gate formed on the semiconductor substrate to spread over one end of the first diffused layer and an area between the first and second diffused layers; a first insulating film formed between the floating-gate and the semiconductor substrate so as to allow FN tunneling of carriers between the floating-gate and the first diffused layer and between the floating-gate and the area between the first and second diffused layers; a select gate formed on the semiconductor substrate to spread over one end of the second diffused layer and the area between the first and second diffused layers; a second insulating film disposed between the select gate and the semiconductor substrate; a control gate formed close to at least a part of the floating-gate; and a third insulating film disposed between the floating-gate and the control gate. In this semiconductor storage device, electrons can be injected due to the FN tunneling from the area between the first and second diffused layers in the semiconductor substrate into the floating-gate through the first insulating film and extracted due to the FN tunneling from the floating-gate to the first diffused layer through the first insulating film.

Owing to this structure, the electrons can be injected into the floating-gate by utilizing the FN tunneling instead of utilizing the source side injection mechanism. As a result, a current required for injecting and extracting the elections can be decreased to approximately 1 nA/cell. Since the current for injection is thus decreased, a power shortage is not caused even when a drain voltage is increased from the supply voltage so as to inject the electrons into a large number of memory cells at a time. Thus, the semiconductor storage device can be operated at a low voltage. In addition, as compared with the conventional general semiconductor storage device in which the electrons are injected and extracted between the drain region and the floating-gate by utilizing the FN tunneling, the electrons pass through different portions of the first insulating film in the injection and the extraction, resulting in improving the durability of the first insulating film.

The first insulating film is preferably made of a silicon oxide film having a thickness exceeding 5 nm and smaller than 10 nm.

The semiconductor storage device can adopt any of the following preferable embodiments:

The select gate can be made of a first conductive film deposited on the semiconductor substrate, the floating-gate can be a sidewall formed out of a second conductive film deposited on a side surface of the select gate with a fourth insulating film sandwiched, and the control gate can be made of a third conductive film deposited on the select gate and the floating-gate with the third insulating film sandwiched.

By adopting this embodiment, the floating-gate can be formed in a self-alignment manner against the select gate, and hence, the floating-gate and the select gate can be formed within a very small area. In this manner, the integration of the semiconductor storage device can be improved.

The control gate and the select gate can be formed as a common member.

By adopting this embodiment, the number of conductive films required for forming the gates can be decreased, resulting in decreasing the manufacturing cost.

The floating-gate and the select gate can be both made of a first conductive film deposited above the semiconductor substrate, and the control gate can be made of a second conductive film deposited on the first conductive film with the third insulating film sandwiched.

By adopting this embodiment, the gates can be formed out of merely two conductive films, resulting in decreasing the manufacturing cost.

The space between the floating-gate and the select gate can be filled with a fourth insulating film.

By adopting this embodiment, the space between the floating-gate and the select gate can be decreased, resulting in further improving the density of the semiconductor storage device.

The control gate can be formed close to the floating-gate alone.

By adopting this embodiment, the parasitic capacitance derived from closeness between the control gate and the select gate can be decreased, resulting in increasing the operation speed of the semiconductor storage device.

The semiconductor storage device can further comprise a third diffused layer formed in an area of the semiconductor substrate between the floating-gate and the select gate, and the third diffused layer has the same depth and the same impurity concentration as the first and second diffused layers.

By adopting this embodiment, the memory cells can be excellently operated even when the space between the floating-gate and the select gate is large.

In this case, the control gate can be close to an upper surface and side surfaces of the floating-gate with the third insulating film sandwiched.

As a result, the capacitance between the control gate and the floating-gate can be increased, and hence, the electrons can be injected into the floating-gate more easily.

The control gate can have the same width as the floating-gate, a dummy gate having the same width as the select gate can be formed above the select gate out of the second conductive film, and a fifth insulating film having the same thickness and made of the same material as the third insulating film can be formed between the dummy gate and the select gate.

By adopting this embodiment, there is no need to provide a margin between the control gate and the floating-gate in consideration of mask alignment shift, resulting in decreasing the size of each memory cell. Furthermore, since no portion of the control gate is close to the surface of the semiconductor substrate, no large electric field is applied to the insulating film on the semiconductor substrate even when a voltage for electron injection/extraction is applied to the control gate. Thus, the reliability of the semiconductor storage device can be improved.

In this case, at least one end of the dummy gate can be removed.

As a result, it is possible to easily form a line to be connected with the select gate without interfering with the dummy gate.

The semiconductor storage device can further comprises a memory cell array including a plurality of the memory cells aligned in a matrix; word lines each provided to each row of the memory cells in the memory cell array commonly connected with the control gates of the memory cells disposed in each row in the memory cell array; select lines each provided to each row of the memory cells in the memory cell array commonly connected with the select gates of the memory cells disposed in each row in the memory cell array; bit lines each provided to each column of the memory cells in the memory cell array commonly connected with the first diffused layers of the memory cells disposed in each column in the memory cell array; and source lines each provided to each row of the memory cells in the memory cell array commonly connected with the second diffused layers of the memory cells disposed in each row in the memory cell array.

By adopting this embodiment, the bit lines extend along the columns while the select lines extend along the rows. When both the bit lines and select lines extend along the columns or the rows, a leakage current can flow between a source line and a bit line through the turned-on select Tr of an unselected memory cell in a read operation. This leakage current can cause error read that the selected memory cell is judged to be in a written state although it is actually in an erased state. In contrast, since the bit lines are perpendicular to the select lines in this semiconductor storage device, such error read can be definitely avoided.

In this case, the memory cells in the memory cell array can be disposed so that arbitrary two adjacent memory cells in each column have the first diffused layer and the second diffused layer in common, and each of the source lines can be provided per two rows of the memory cells.

This structure can simplify the source lines, resulting in simplifying the entire structure of the memory cell array.

The fundamental method of driving a semiconductor storage device of this invention is a driving method for a semiconductor storage device comprising a memory cell including a first diffused layer and a second diffused layer of a second conductivity type formed in an area of a first conductivity type in a semiconductor substrate with a space therebetween; a floating-gate formed on the semiconductor substrate so as to spread over one end of the first diffused layer and an area between the first and second diffused layers; a first insulating film formed between the floating-gate and the semiconductor substrate so as to allow FN tunneling of carriers between the floating-gate and the first diffused layer and between the floating-gate and the area between the first and second diffused layers; a select gate formed on the semiconductor substrate so as to spread over one end of the second diffused layer and the area between the first and second diffused layers; a second insulating film disposed between the select gate and the semiconductor substrate; a control gate formed close to at least a part of the floating-gate; and a third insulating film disposed between the floating-gate and the control gate. In this driving method, in injecting electrons into the floating-gate, the floating-gate is set at a higher potential than the semiconductor substrate, so that the electrons are moved from the area between the first and second diffused layers in the semiconductor substrate to the floating-gate due to FN tunneling, and in extracting electrons, the floating-gate is set at a lower potential than the first diffused layer, so that the electrons are moved from the floating-gate to the first diffused layer due to the FN tunneling.

An operation for injecting the electrons into the floating-gate can be defined as an erase operation, and an operation for extracting the electrons from the floating-gate can be defined as a write operation.

In this driving method, the electrons are injected into the floating-gate not by utilizing the source side injection mechanism but by utilizing the FN tunneling. Therefore, a current required for injecting and extracting the electrons can be decreased to approximately 1 nA/cell. Since the current for the injection is thus decreased, a power shortage is not caused even when a drain voltage is increased from a supply voltage so as to inject the electrons into a large number of memory cells at a time. As a result, this semiconductor storage device which can be operated at a low voltage is capable of page write and page erase of a large number of memory cells. In addition, as compared with the conventional general method in which the electrons are injected/extracted between the drain region and the floating-gate by utilizing the FN tunneling, the electrons pass through different portions of the first insulating film in the electron injection and extraction. Therefore, it is possible to suppress the degradation of the entire first insulating film, resulting in improving the reliability. Thus, the lifetime of the semiconductor storage device can be remarkably elongated.

In the method of driving a semiconductor storage device, the semiconductor storage device can further comprise a memory cell array including a plurality of the memory cells aligned in a matrix; word lines each provided to each row of the memory cells in the memory cell array commonly connected with the control gates of the memory cells disposed in each row in the memory cell; select lines each provided to each row of the memory cells in the memory cell array commonly connected with the select gates of the memory cells disposed in each row in the memory cell array; bit lines provided to each column of the memory cells in the memory cell array commonly connected with the first diffused layers of the memory cells disposed in each column in the memory cell array; and source lines provided to each row of the memory cells in the memory cell array commonly connected with the second diffused layers of the memory cells disposed in each row in the memory cell array. In this method, in an erase operation, a potential of a selected word line can be set at a positive value and unselected word lines can be grounded, and a potential of the semiconductor substrate can be set at a negative value.

Alternatively, in an erase operation, a potential of a selected word line can be set at a large positive value and unselected word lines can be grounded, and the semiconductor substrate can be grounded.

In any of the aforementioned embodiments, the erase operation can be definitely conducted at a time on the memory cells commonly connected with each word line.

BRIEF DESCRIPTION OF THE DRAWINGS

FIG. 23 is a plan view for illustrating the manufacturing procedures of the memory cell of the EEPROM of the fourth embodiment;

DETAILED DESCRIPTION OF THE INVENTION (Embodiment 1)

The first embodiment will now be described referring to the accompanying drawings.

Figure 1:
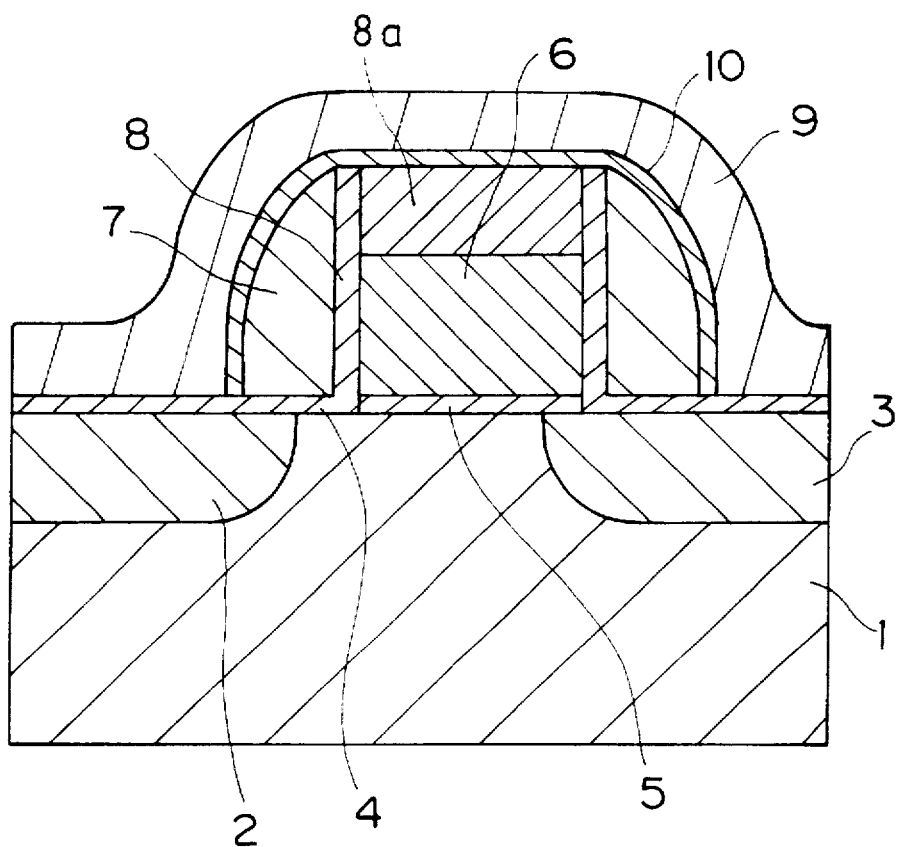
FIG. 1 is a sectional view for showing the structure of a memory cell of an EEPROM according to a first embodiment.

FIG. 1 is a sectional view for showing the structure of an EEPROM of this embodiment. As is shown in FIG. 1, in a p-type silicon substrate 1, a drain region 2 and a source region 3, that is, n-type impurity diffused layers, are formed with a space therebetween. On the p-type silicon substrate 1 between the source region 3 and the drain region 2, a select gate 6 of a first polysilicon film is formed with a gate insulating film 5 sandwiched. Sidewalls are formed on both sides of the select gate 6 by anisotropically etching a second polysilicon film deposited with an insulating film 8 of an ONO film sandwiched. One of these two sidewalls that is above the drain region 2 works as a floating-gate 7. On the select-gate 6, a comparatively thick silicon oxide film 8a is formed. On the select gate 6 and the floating-gate 7, a control gate 9 of a polysilicon film is formed with an insulating film 10 of an ONO film sandwiched. Between the drain region 2 and the floating-gate 7 is formed a tunnel oxide film 4 with a thickness of approximately 10 nm.

Figure 2:
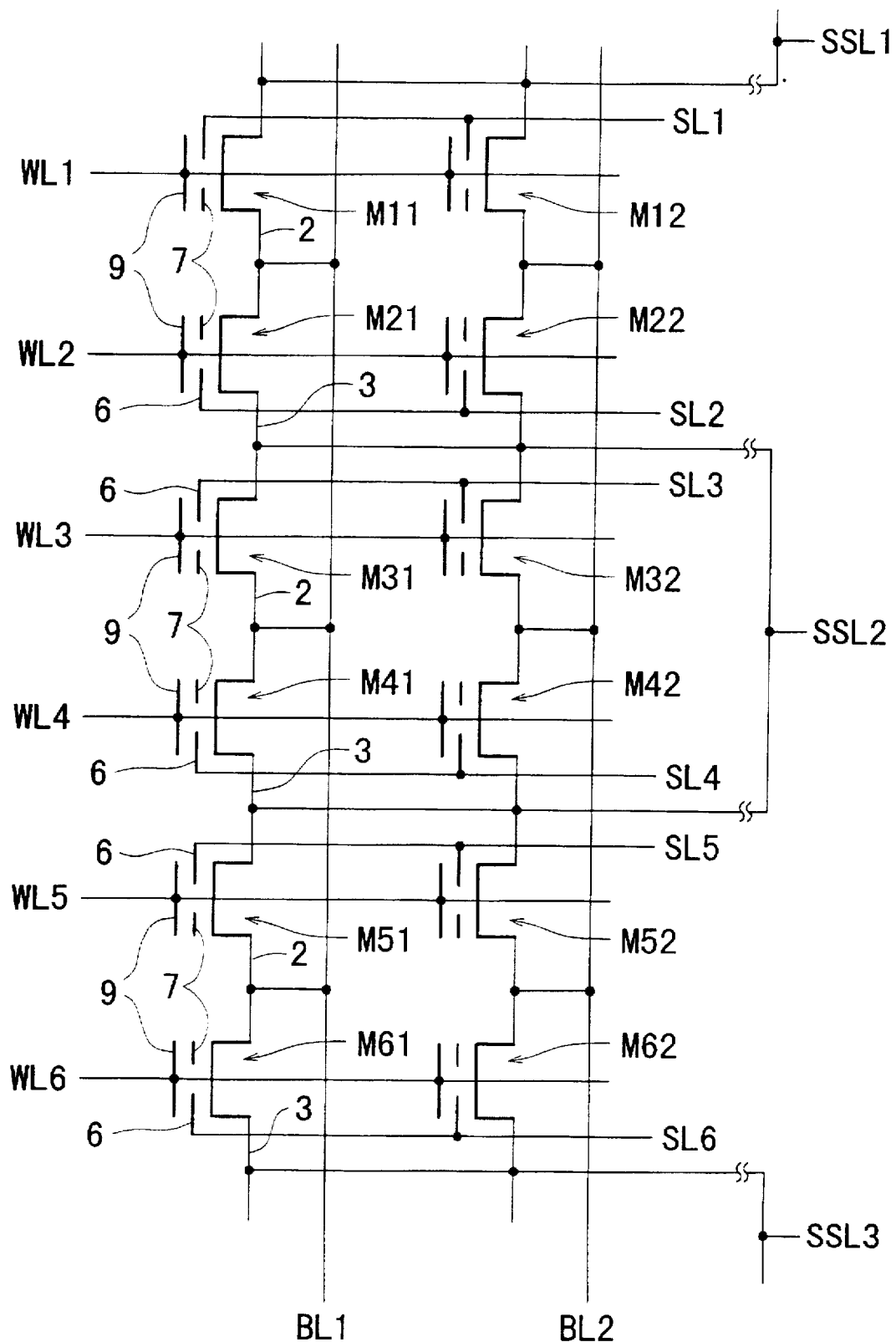
FIG. 2 is an electric circuit diagram of a memory cell array of the EEPROM of the first embodiment.

FIG. 2 is a circuit diagram for partly showing the configuration of a memory cell array of the EEPROM formed by aligning a plurality of memory cells as shown in FIG. 1. As is shown in FIG. 2, in this memory cell array, a number of memory cells Mmn are disposed in a matrix, and in each column of the memory cells, the drain regions of adjacent memory cells are formed as a common drain region and the source regions of adjacent memory cells are formed as a common source region. Each element of the memory cell of FIG. 1 is connected in this circuit diagram in the following manner: The control gates 9 of the memory cells are connected with word lines WL1, WL2, etc. extending along respective rows of the memory cells. The drain regions 2 of adjacent memory cells, for example, of memory cells M11 and M21, are commonly connected with a bit line BL1 extending along the column. Furthermore, a source line is provided for connection with the source regions 3 which commonly belong to memory cells in two rows, and two source lines are combined with each other, so that a combination of four rows corresponding to four word lines is provided with each of source lines SSL1, SSL2, etc. The select gates 6 of the memory cells disposed in one row are respectively connected with select lines SL1, SL2, etc. extending along the respective rows.

It is noted that the connection of the source lines in the memory cell array of the present semiconductor storage device is not limited to that described above.

Now, a write operation and an erase operation for these memory cells will be described referring to Table 1 and FIGS. 3 through 7. Table 1 is a list for showing the setting of voltages in write, erase and read operations, and FIGS. 3 through 7 specifically show the voltage at each element in each operation listed in Table 1.

[Table 1]

Write Operation (Extraction)

In a write operation for, for example, a memory cell M42, with the respective select lines SL1, SL2, etc. set at 0 V, with the respective source lines SSL1, SSL2, etc. opened, and with the silicon substrate 1 grounded, the potential of the bit line BL2 connected with the drain region of the memory cell M42 to be written is set to be higher than the potential of the word line WL4 connected with the control gate of the memory cell 42, to the extent that an FN tunnel current can flow. This setting extracts electrons stored in the floating-gate 7 to the drain region 2, namely, to the bit line BL2. In this case, the potentials of the word lines, the bit lines, the select lines and the like can be set by the following two modes:

(Mode 1)

Figure 3:
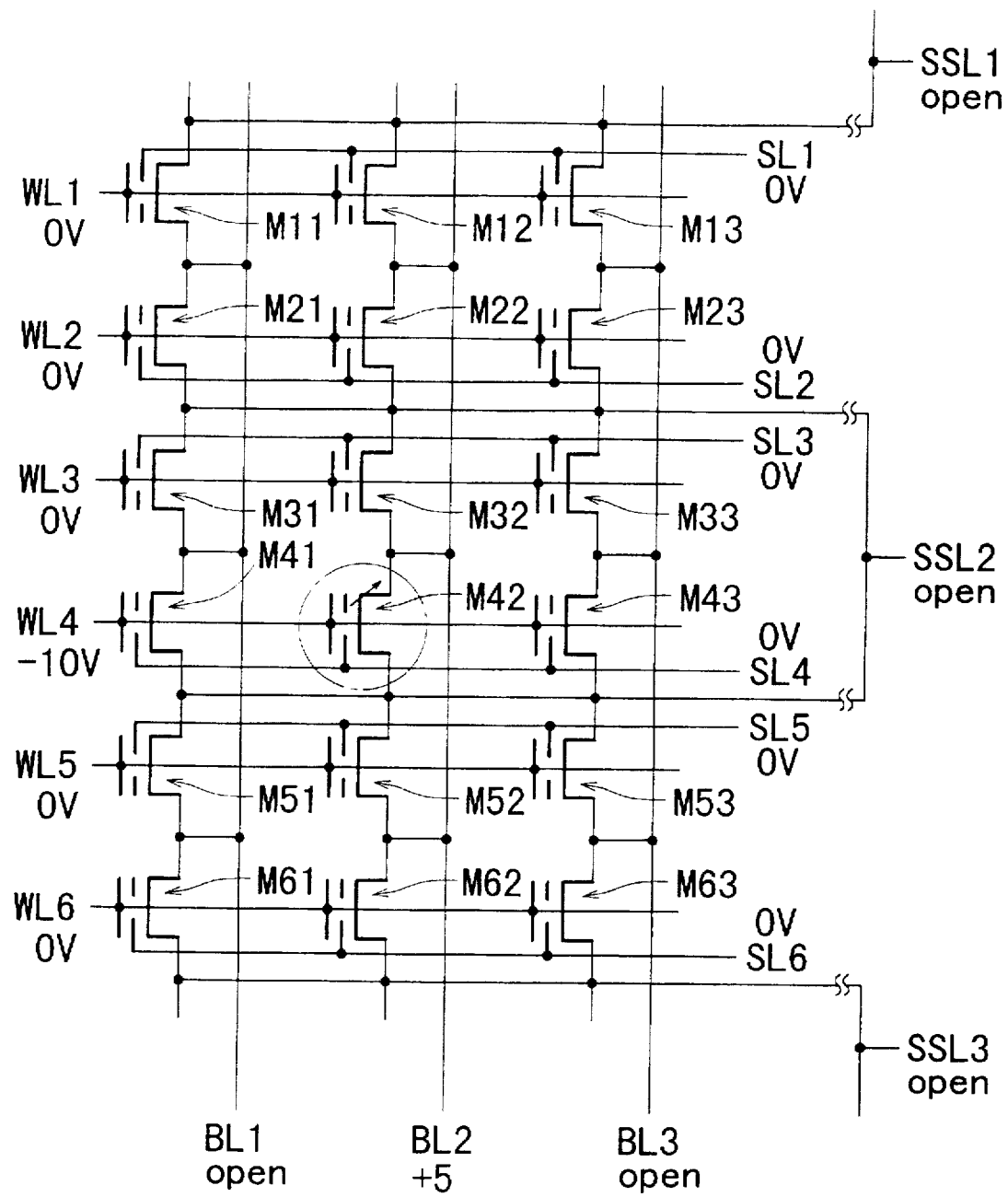
FIG. 3 is an electric circuit diagram for showing the setting of a voltage at each element of the EEPROM of the first embodiment in a write operation by Mode 1.

As is shown in FIG. 3, the potential of the word line WL4 connected with the memory cell M42 to be written is set at −10 V, the other word lines (unselected word lines) WL1, WL2, WL3, WL5, etc. are respectively set at 0 V, the potential of the bit line BL2 connected with the memory cell M42 is set at a positive voltage of 5 V, and the other bit lines BL1, BL3, etc. are respectively opened. All the select lines SL1, SL2, etc. are grounded, and all the source lines SSL1, SSL2, etc. are opened.

(Mode 2)

Figure 4:
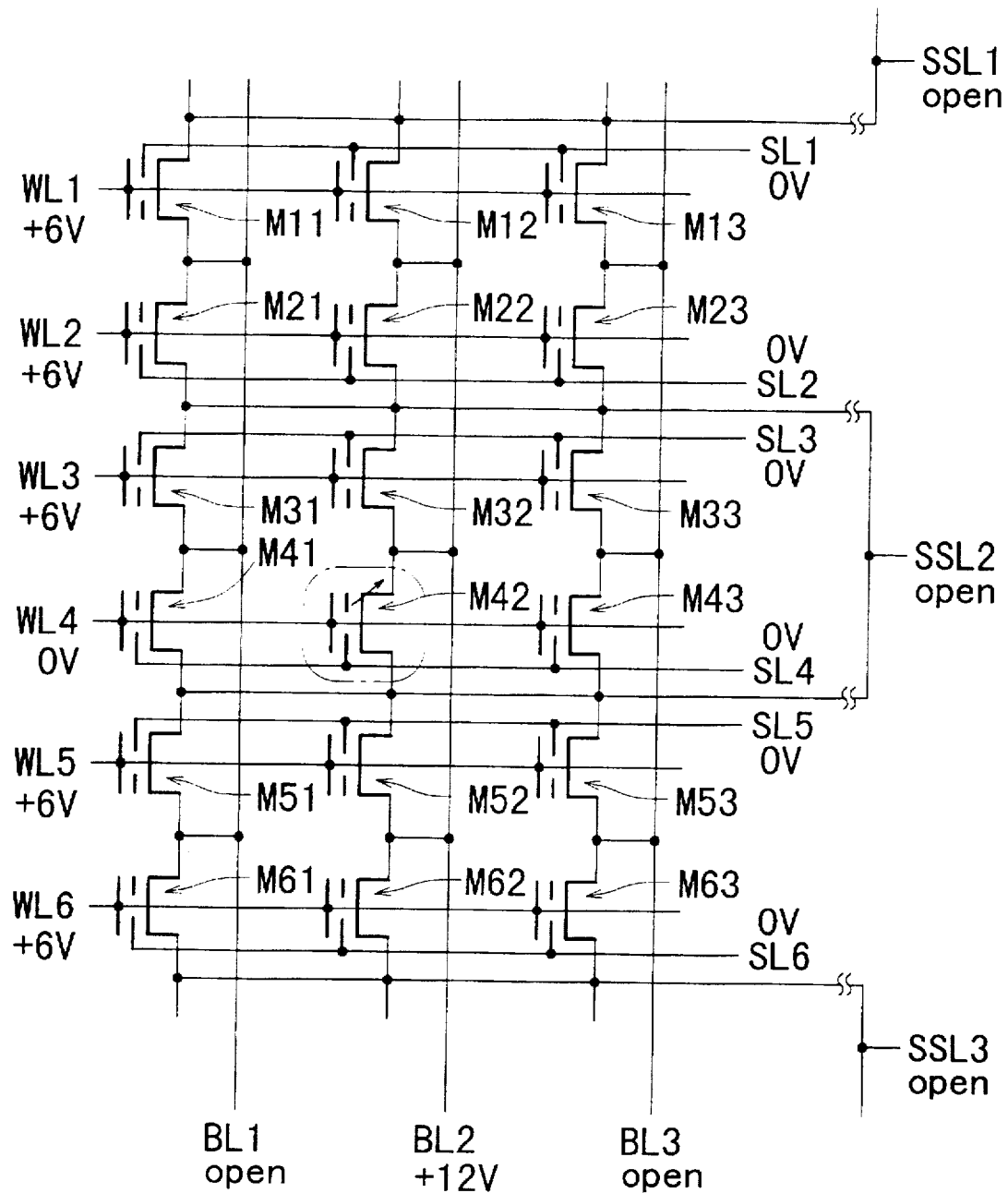
FIG. 4 is an electric circuit diagram for showing the setting of a voltage at each element of the EEPROM of the first embodiment in a write operation by Mode 2.

As is shown in FIG. 4, the word line WL4 connected with the memory cell M42 to be written is grounded, the potentials of the other word lines WL1, WL2, WL3, WL5, etc. are respectively set at 6 V, the potential of the bit line BL2 connected with the memory cell M42 is set at 12 V, and the other bit lines BL1, BL3, etc. are respectively opened. All the select lines SL1, SL2, etc. are grounded, and all the source lines SSL1, SSL2, etc. are opened.

By setting the potentials in the aforementioned manner, electrons can be selectively extracted from the floating-gate of the memory cell M42 alone, which is disposed at the intersection between the word line WL4 and the bit line BL2, namely, the memory cell M42 can be placed in a written state.

Erase Operation (Injection)

In the case where all the memory cells commonly connected with at least one word line in the memory cell array are desired to be placed in an erased state, with the potential of that word line set at a positive high voltage and with the potential of the silicon substrate set at a low voltage, a potential difference between the control gate and the silicon substrate is set to be large to the extent that an FN tunnel current can flow between the floating-gate and the silicon substrate. Thus, in each of the memory cells commonly connected with at least one word line in the memory cell array, electrons are injected from an area between the source and drain regions in the silicon substrate into the floating-gate through the tunnel insulating film.

It is preferred that at least one of the source and drain regions is set at the same potential as the silicon substrate. A carrier supply source is required for implanting carrier (electrons in this case) from the substrate, wherein the source or drain serves as the carrier supply source in this case. At this time, the voltage applied to the source/drain is made equal to that of the substrate for the purposes of obtaining the most sharp potential gap between the floating-gate and the substrate via the tunnel oxide film, thereby enhancing implantation efficiency. For example, when the potential of the drain region is set at the same low potential as the substrate, the above-described purposes can be achieved with ease because the drain region itself opposes the floating-gate with the tunnel oxide film therebetween. However, a column decoder is generally disposed in the drain region, and the circuit structure is complicated when the potential of the column decoder can be positively and negatively changed. Therefore, it is advantageous to set the source region at a low potential in some case. Although the source region is away from the floating-gate, when, for example, the potential of the substrate is set at −8 V, as is shown in Table 1, it is possible to sufficiently invert the potential of an area of the substrate below the select gate so as to retain the potential of an area of the substrate opposing the edge, which is close to the source region, of the floating-gate at −8 V by setting the potential of the select gate at −4 V and the potential of the source region of the selected memory cell at −8 V. In this case, by setting the potential of the source region of an unselected memory cell at −4 V (i.e., a half of the potential of the source region of the selected memory cell) and setting the potential of the select gate at 0 V, the potential of the area of the substrate opposing the edge, which is close to the source region, of the floating-gate can be retained at −4 V so as not to conduct an erase operation in the unselected memory cell.

In this case, the potentials of the word lines, the silicon substrate, the bit lines and the like can be specifically set by, for example, any of the following modes:

(Mode 1)

Figure 5:
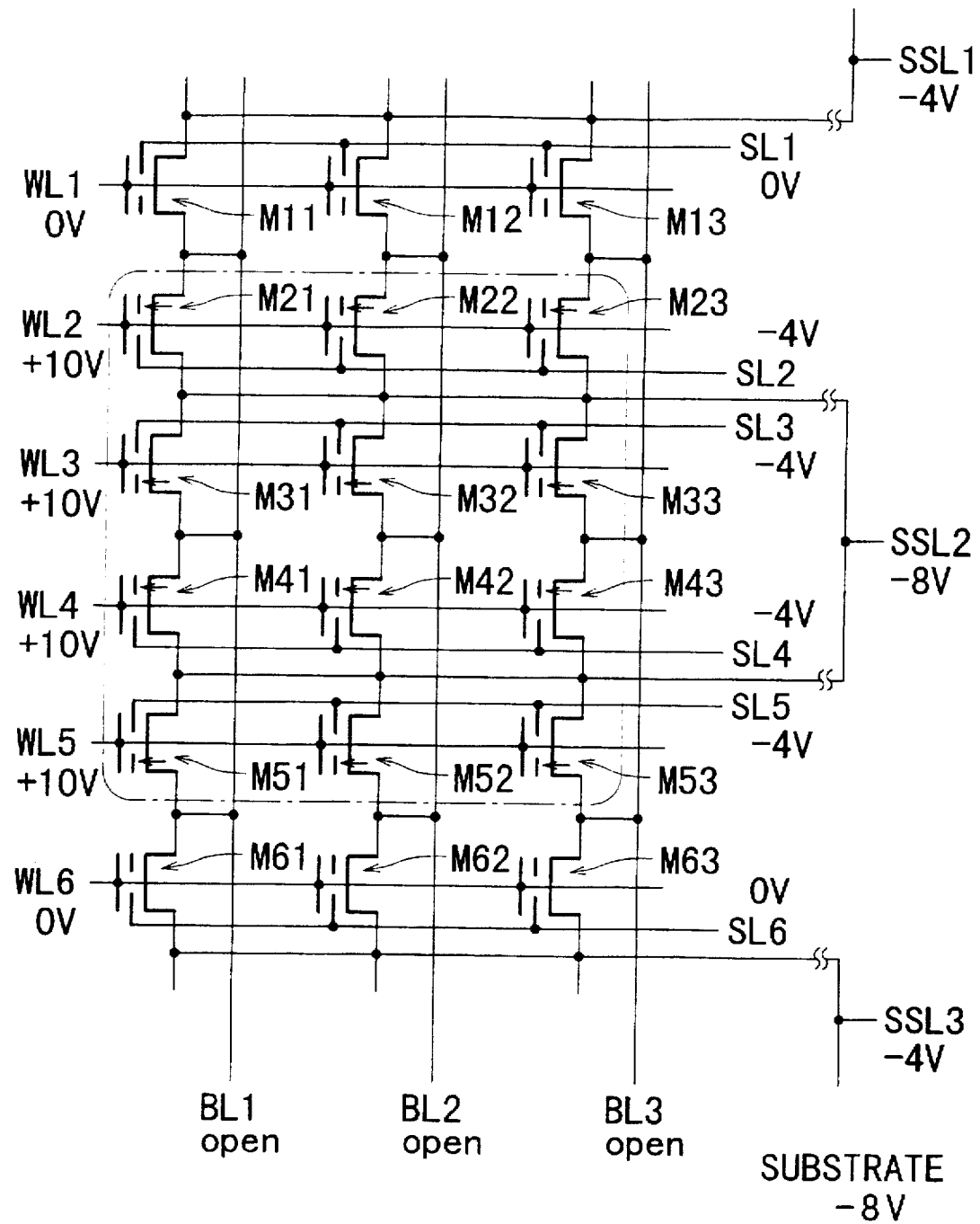
FIG. 5 is an electric circuit diagram for showing the setting of a voltage at each element of the EEPROM of the first embodiment in an erase operation by Mode 1.

As is shown in FIG. 5, the potentials of the four word lines WL2 through WL5 are respectively set at approximately 10 V, the source line SSL2 corresponding to the four word lines WL2 through WL5 is set at −8 V, and the potentials of the select lines SL2 through SL5 corresponding to the four word lines WL2 through WL5 are respectively set at −4 V. The potential of the silicon substrate 1 is set at approximately −8 V. The unselected select lines SL1, SL6, etc. and the unselected word lines WL1, WL6, etc. are grounded, unselected source lines SSL1, SSL3 are set at −4 V, and all the bit lines BL1, BL2, etc. are opened. By setting the potentials in this manner, electrons are injected at a time into the floating-gates of the memory cells connected with the four word lines WL2 through WL5. In the case where all the memory cells are desired to be placed in an erased state, under the conditions shown in FIG. 5, the potentials of all the word lines are respectively set at 10 V, the potentials of all the source lines are respectively set at −8 V, and the potentials of all the select lines SL1, SL2, etc. are respectively set at −4 V.

By adopting the aforementioned erase operation, each sector of the memory cells commonly connected with any of the 4 word lines WL2, WL3, WL4, WL5, etc. can be placed in an erased stated or all the memory cells can be placed in an erased state at a time in this memory cell array. The minimum erasable unit is the number of memory cells connected with 4 lines.

(Mode 2)

Figure 6:
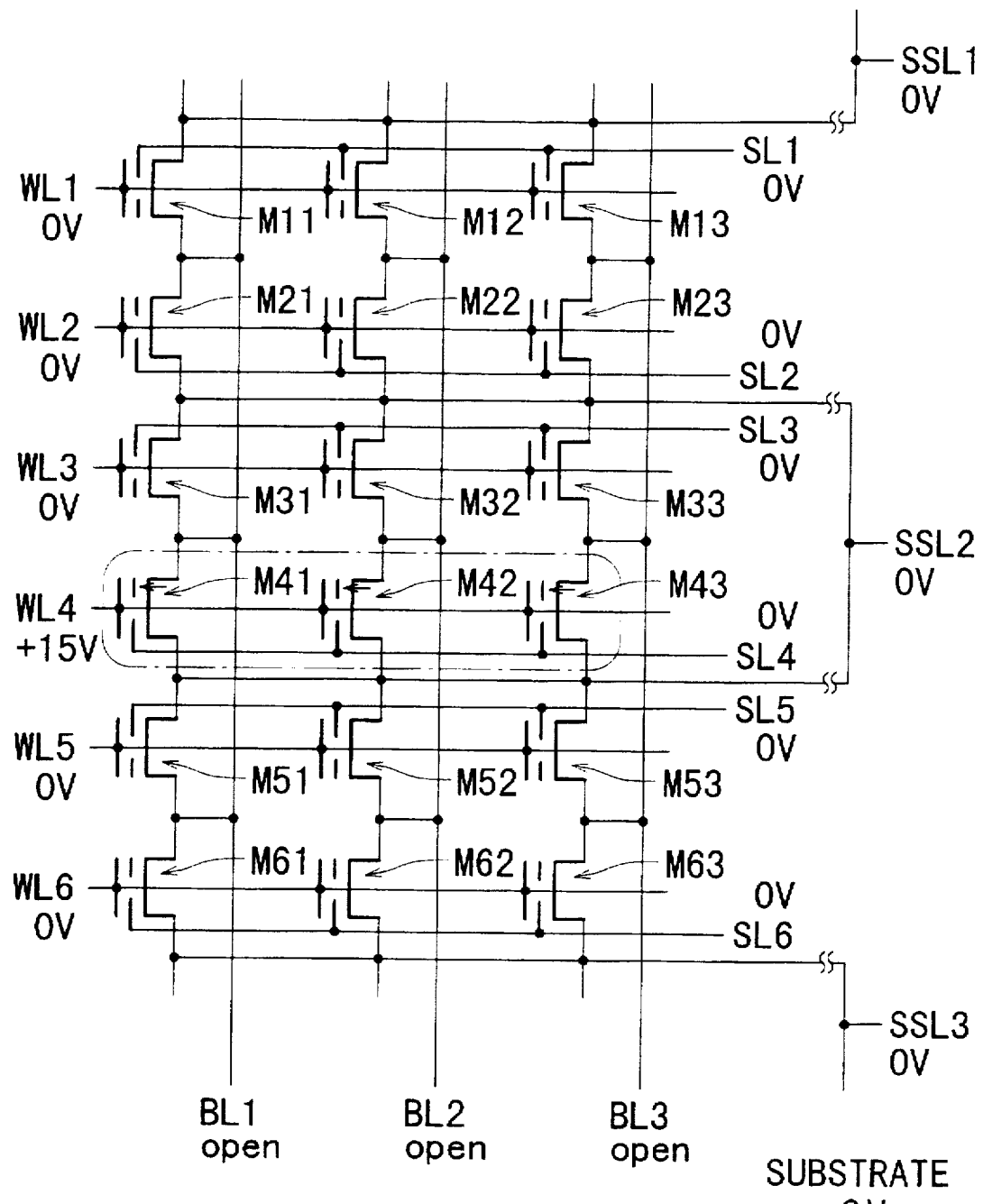
FIG. 6 is an electric circuit diagram for showing the setting of a voltage at each element of the EEPROM of the first embodiment in an erase operation by Mode 2.

As is shown in FIG. 6, the potential of the selected word line WL4 is set at approximately 15 V, the unselected word lines WL1, WL2, WL3, WL5, etc. are grounded, and the silicon substrate 1 is also grounded. All the bit lines BL1, BL2, etc. are opened, and all the select lines SL1, SL2, etc. and all the source lines SSL1, SSL2, etc. are grounded. In the case where all the memory cells are desired to be placed in an erased state, under the conditions shown in FIG. 6, the potentials of all the word lines are respectively set at 15 V.

By adopting the aforementioned erase operation, each sector of the memory cells commonly connected with any of the word lines WL1, WL2, etc. can be placed in an erased state or all the memory cells can be placed in an erased state at a time in this memory cell array. The minimum erasable unit is the number of memory cells connected with one word line.

Read Operation

Figure 7:
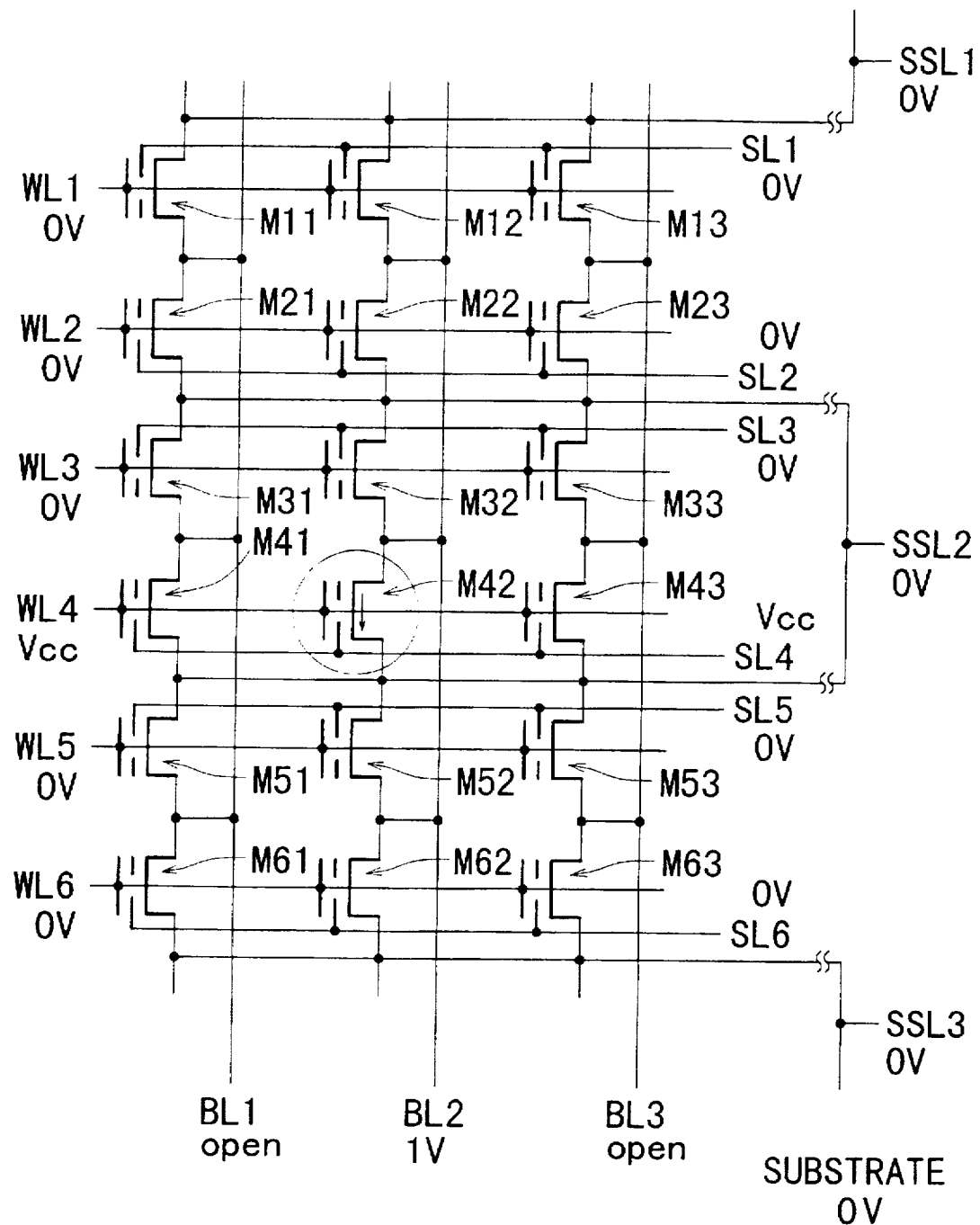
FIG. 7 is an electric circuit diagram for showing the setting of a voltage at each element of the EEPROM of the first embodiment in a read operation.

As is shown in FIG. 7, the potential of the word line WL4 connected with the memory cell M42 to be read is set at a voltage of Vcc (for example, approximately 2.5 through 3.3 V), and the other word lines WL1, WL2, WL3, WL5, etc. are grounded. The potential of the bit line BL2 connected with the memory cell M42 is set at 1 V, and the other bit lines BL1, BL3, etc. are opened. The potential of the select line SL4 connected with the memory cell M42 is set at the voltage of Vcc, and the other select lines SL1, SL2, SL3, SL5, etc. and all the source lines SSL1, SSL2, etc. are grounded. The silicon substrate 1 is also grounded.

Figure 8:
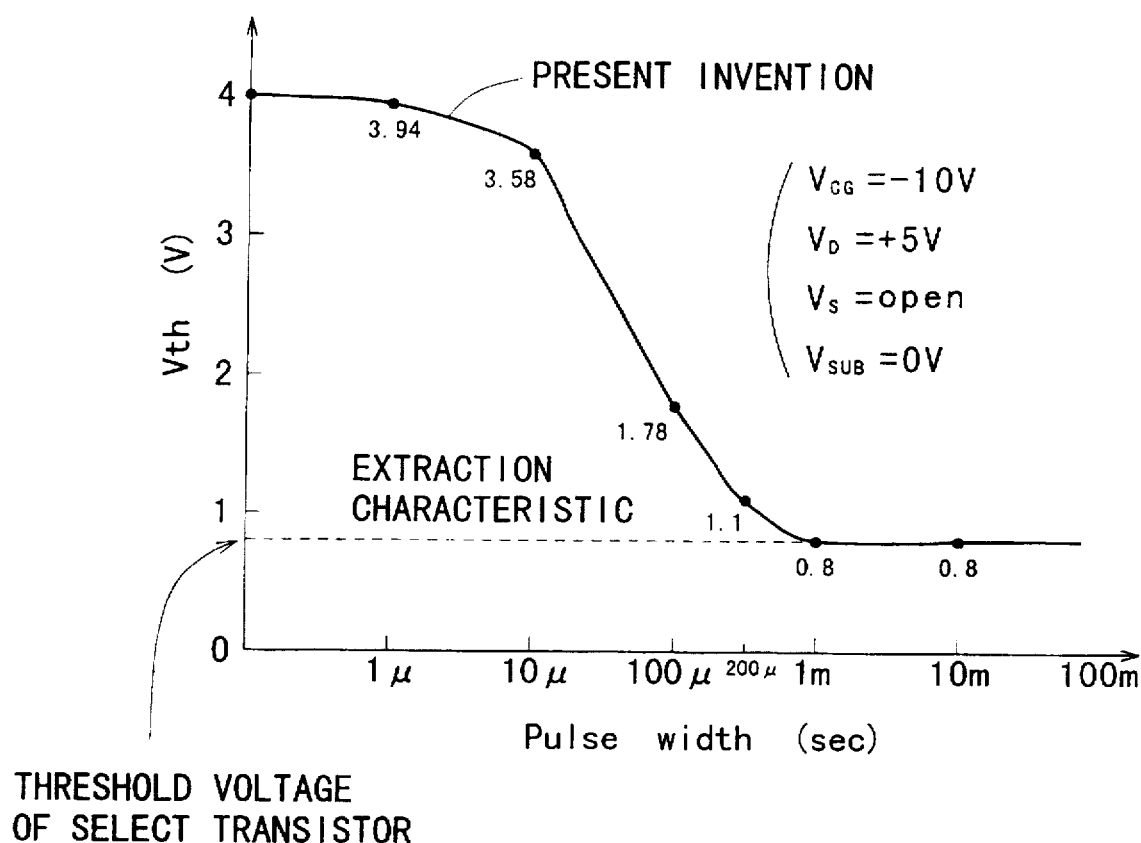
FIG. 8 shows the relationship between a pulse width of a signal and a threshold voltage in extracting electrons from a floating-gate of the memory cell of the EEPROM of the first embodiment.

FIG. 8 is a characteristic diagram for showing the relationship between the threshold voltage and the pulse width of a signal used in the electron extraction (write operation) by Mode 1 of this embodiment. Also in the conventional technique, the electrons are extracted from the floating-gate by utilizing the FN tunneling of the electrons from the floating-gate to the drain region, and hence, substantially the same characteristic can be obtained by the conventional storage device. A current required for extracting the electrons is approximately 1 nA/cell in both the present device and the conventional device.

Figure 9:
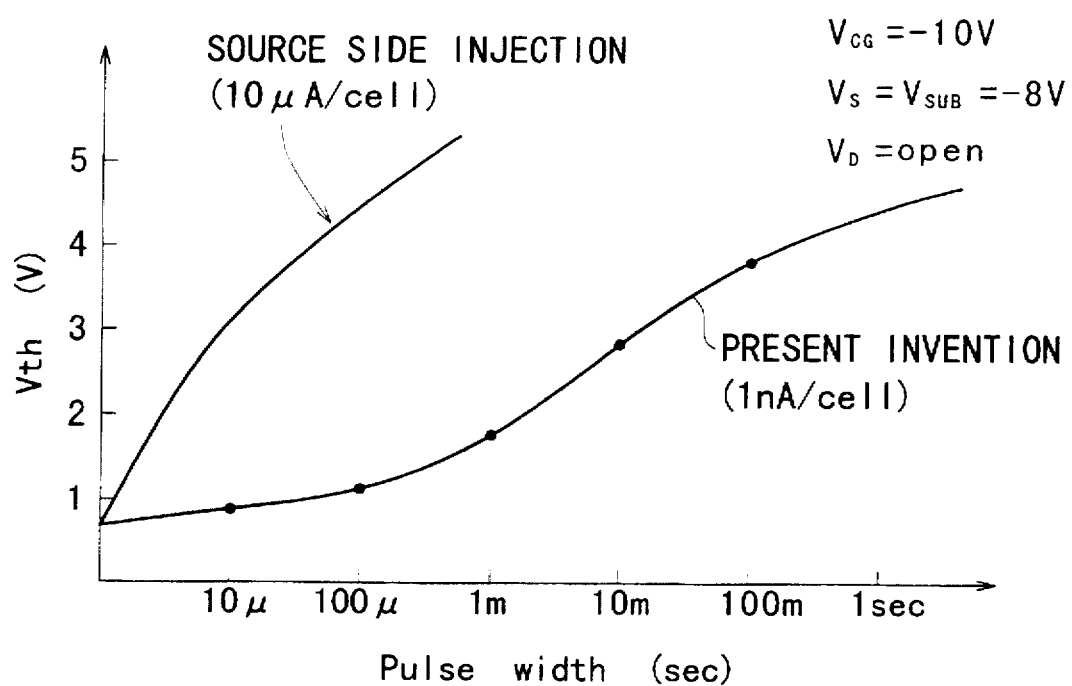
FIG. 9 shows the relationship between a pulse width of a signal and a threshold value in injecting electrons into the floating-gate of the memory cell of the EEPROM of the first embodiment.

Furthermore, FIG. 9 is a characteristic diagram for showing the relationship between the pulse width of a signal used in injecting the electrons by Mode 1 (shown with a solid curve) and by the conventional source side injection (shown with a broken line) and the threshold voltage Vth corresponding to the charge amount in the floating gate. Also in the other embodiments of the invention, the FN tunneling from the area between the source and drain regions in the silicon substrate to the floating-gate is utilized, and hence, substantially the same characteristic can be obtained. In adopting the source side injection, time required for injecting a given amount of charges is very short and the electrons can be rapidly injected. However, a current required for the injection is as small as approximately 1 nA/cell in this embodiment, while it is as large as approximately 10 µA/cell in the conventional source side injection. At this point, when it is assumed that an allowable total current is approximately 100 µA, the electrons can be injected into merely approximately ten memory cells by the conventional source side injection. In contrast, the electrons can be injected into approximately 100,000 memory cells at a time in this invention.

The comparison between the invention and the conventional source side injection on the basis of these data reveals the following: There is substantially no difference in time and a current required for extracting the electrons from the floating-gate between the invention and the conventional technique. However, a current required for electron injection into the floating-gate in the present EEPROM is approximately 1/10000 as large as a current required in the conventional EEPROM utilizing the source side injection. Accordingly, a large number of memory cells can be dealt with at a time in both injection and extraction of the electrons into and from the floating-gate in the present device. In other words, a page write operation and a page erase operation can be conducted on a large number of memory cells. In contrast, in the source side injection, when the electron injection into the floating-gate is defined as an erase operation, the memory cells commonly connected with one word line cannot be erased at a time, and hence, the electron injection into the floating-gate is generally defined as a write operation. In this case, the number of memory cells which can be written at a time is very small.

Furthermore, in the conventional EEPROM in which the electrons are injected from the drain region into the floating-gate, the FN tunneling of the electrons is effected through the same portion of the oxide film in both the extraction and the injection. Therefore, the oxide film is largely damaged owing to the FN tunneling, resulting in decreasing the number of times of repeating the write/erase cycles. In contrast, the write and erase operations are conducted through different portions of the oxide film in the present device, resulting in elongating the lifetime of the device.

Accordingly, an FN tunnel current can be utilized in both write operation (extraction) and erase operation (injection) in this embodiment. In the injection utilizing the FN tunnel current, the electrons are injected from the side of the substrate as described above, so that a smaller current is required for the injection than in the conventional source side injection. Therefore, the number of memory cells into which the electrons can be injected at a time is remarkably increased, and hence, a high speed operation of the entire system can be attained. Also, this means that a lower supply voltage can be increased to be used for write and erase operations.

In addition, in the structure of the memory cell of the EEPROM of this embodiment, the floating-gate 7 is formed in a self-alignment manner against the select gate 6, and therefore, the EEPROM can advantageously attain a very high density.

Furthermore, by adopting the structure of the memory cell array and the driving method of this embodiment, there is no need to provide write verification, which is necessary for a conventional FN write/FN erase type memory cell array in order to prevent excess write (namely, excessive electron extraction from the floating-gate, which places the memory cell always in an on-state). This is because the memory cell adopted in this embodiment includes an area which is not covered with the floating-gate, namely, an area covered with the select gate alone, between the source and drain regions. This also makes contribution to shortening time required for the write operation of the entire system. Also, by adopting the aforementioned operations, the number of times of rewrite can be expected to remarkably increase because the mechanism which is the most stable and causes the smallest write/erase damage at this point of time (i.e., the FN current) can be used.

In particular, since the select lines extend not along the columns but along the rows in this embodiment, the select lines are perpendicular to the bit lines extending along the columns. When the select lines extend along the columns in the same direction as the bit lines, a leakage current can flow between a source line and a bit line through the turned-on select Tr of an unselected memory cell in a read operation. Owing to this leakage current, there is a possibility of error read that the selected memory cell is judged to be in a written state although it is actually in an erased state. In contrast, when the select lines are perpendicular to the bit lines as in this embodiment, such error read can be definitely avoided.

(Embodiment 2)

Figure 10:
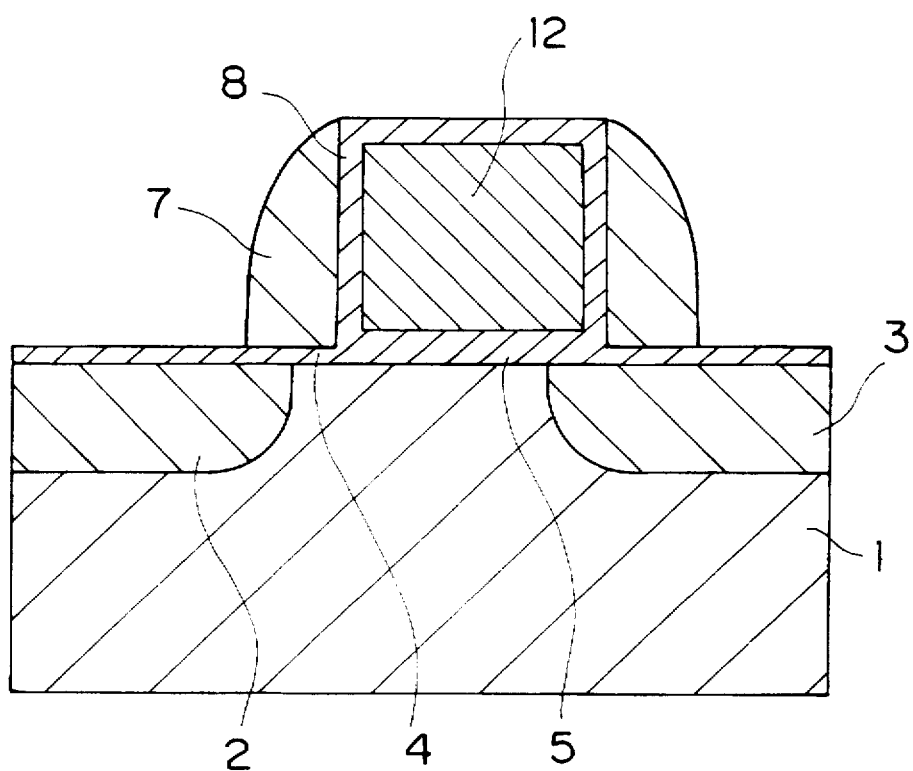
FIG. 10 is a sectional view for showing the structure of a memory cell of an EEPROM of a second embodiment.

FIG. 10 is a sectional view for showing the structure of a memory cell of an EEPROM of the second embodiment. The structure of the memory cell of this embodiment is characterized by a control select gate 12 formed as a common member serving as both a control gate and a select gate. Furthermore, a gate oxide film 5 is much thicker than that of Embodiment 1.

In the structure of this embodiment, a select line SL is conductive with a word line WL in a given memory cell. Therefore, for example, in the electron extraction from the floating-gate by Mode 1 shown in FIG. 3, a voltage of −10 V is applied to the select line SL4. Specifically, in the memory cell shown in FIG. 10, the potential of the control select gate 12 is set at a low potential of −10 V, the potential of a drain region 2 is set at 5 V, so that the electrons in a floating-gate 7 is extracted to the drain region 2. At this point, since a source region 3 is opened, there is no movement of the electrons between the control select gate 12 and the source region 3, and hence no problem is caused. Similarly, also in the write operation by Mode 2 shown in FIG. 4, there arises no problem.

Also, in the erase operations shown in FIGS. 5 and 6, a voltage of approximately 15 through 18 V is applied between the control select gate 12 and a silicon substrate 1. However, when the insulating film 5 below the control select gate 12 has a sufficiently larger thickness than an insulating film below the floating-gate 7, there is no electron movement between the gate and the substrate, causing no problem.

Furthermore, in the read operation shown in FIG. 7, the potentials of both the word line WL4 and the select line SL4 connected with the memory cell M42 to be read are set at the voltage of Vcc, and hence, there is no problem even when the word line is conductive with the select line.

When the control select gate formed by integrating the control gate and the select gate is provided as in this embodiment, the write, erase and read operations can be performed in the same manner as described in Embodiment 1. Since the control gate and the select gate are integrated in this embodiment, the EEPROM can attain a further higher density.

In addition, by adopting the structure of this embodiment, the word line and the select line can be unified into one line, resulting in remarkably improving the integration of the circuit.

(Embodiment 3)

EEPROMs of the third embodiment will now be described referring to FIGS. 11 through 15.

Figure 11:
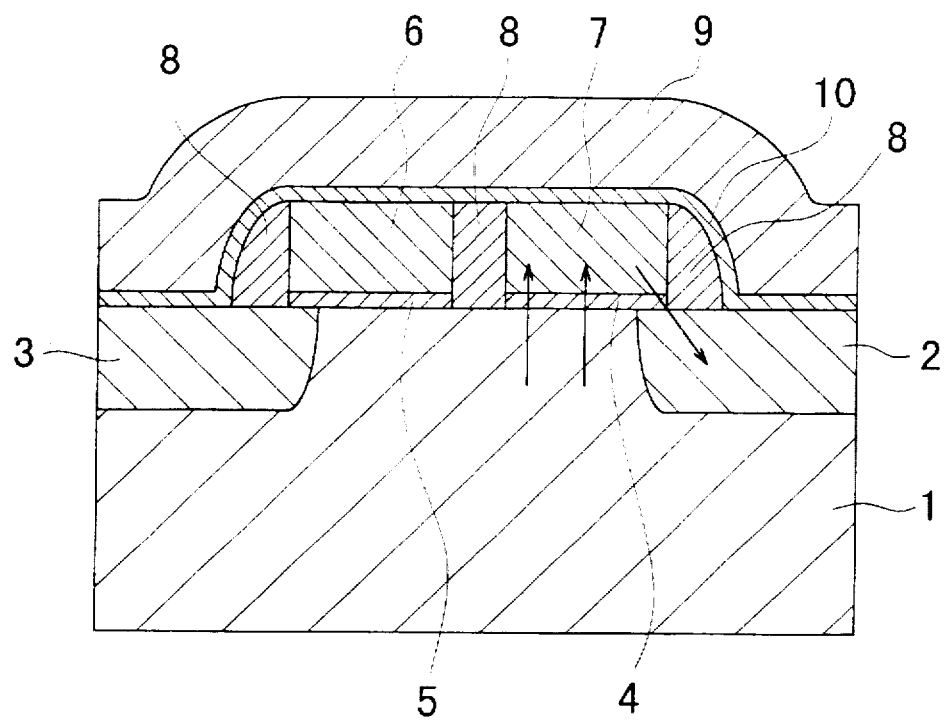
FIG. 11 is a sectional view for showing the structure of a memory cell of a firs type EEPROM of a third embodiment.

FIG. 11 is a sectional view for showing the structure of a memory cell of a first type EEPROM of this embodiment. As is shown in FIG. 11, in the first type EEPROM, a select gate 6 and a floating-gate 7, which are patterned out of the same polysilicon film, are formed on a p-type silicon substrate 1 with gate insulating films 5 and 4 each having a thickness of approximately 5 through 10 nm sandwiched, respectively. Between the gates 6 and 7 and on the side surfaces thereof is formed an insulating film 8 of a silicon oxide film. On the gates 6 and 7, a control gate 9 of a polysilicon film is formed with an ONO (oxide-nitride-oxide) multilayered insulating film 10, including an oxide film, a nitride film and another oxide film, sandwiched. A drain region 2 and a source region 3, that is, impurity diffused layers, are formed in areas in the p-type silicon substrate 1 on both sides of the pair of the gates 6 and 7.

This structure is similar to that of the EEPROM shown in FIG. 27 previously proposed by the present inventors. Differences are that the gate insulating film is as thin as approximately 5 through 10 nm in this embodiment and that electrons can be injected from an area in the silicon substrate 1 between the source and drain regions by utilizing the FN tunneling in this embodiment without utilizing the source side injection mechanism. Since the electrons are injected into the floating-gate 7 not by utilizing the source side injection but by utilizing the FN tunneling, this EEPROM can attain basically the same effects as those of Embodiment 1. In addition, by adopting this structure, the semiconductor storage device can be manufactured through a bilayer polysilicon film process, and hence, the manufacturing cost can be decreased as compared with Embodiment 1.

Figure 12:
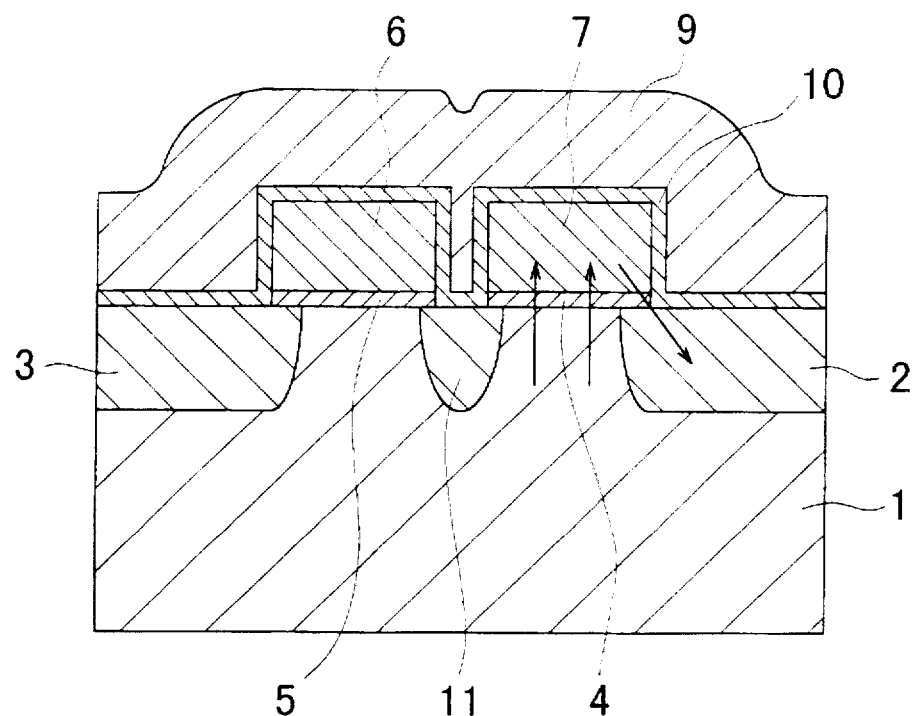
FIG. 12 is a sectional view for showing the structure of a memory cell of a second type EEPROM of the third embodiment.

FIG. 12 is a sectional view for showing the structure of a second type EEPROM of this embodiment. This second type EEPROM can be obtained when the distance between a control gate 6 and a floating-gate 7 is larger than in the first type EEPROM, or when a thin insulating film 10 alone is formed on the gates 6 and 7. In this case, in the implantation of impurity ions for forming a drain region 2 and a source region 3, a diffused layer 11 is formed also in an area in a silicon substrate 1 between the gates 6 and 7. Also by adopting this structure, the EEPROM can attain basically the same effects as those of the first type EEPROM.

Figure 13:
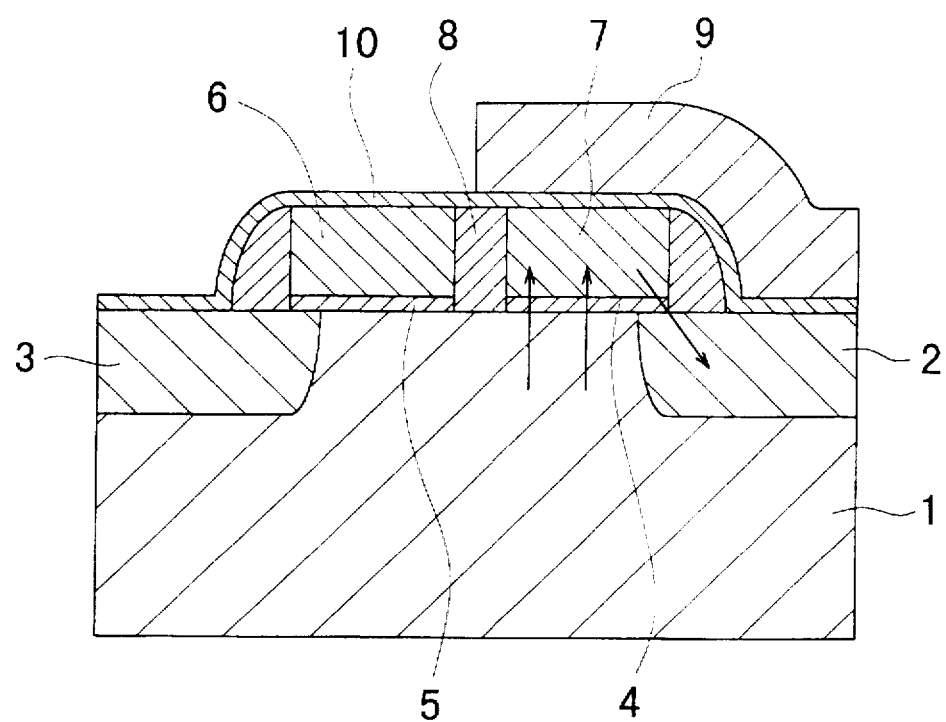
FIG. 13 is a sectional view for showing the structure of a memory cell of a third type EEPROM of the third embodiment.
Figure 14:
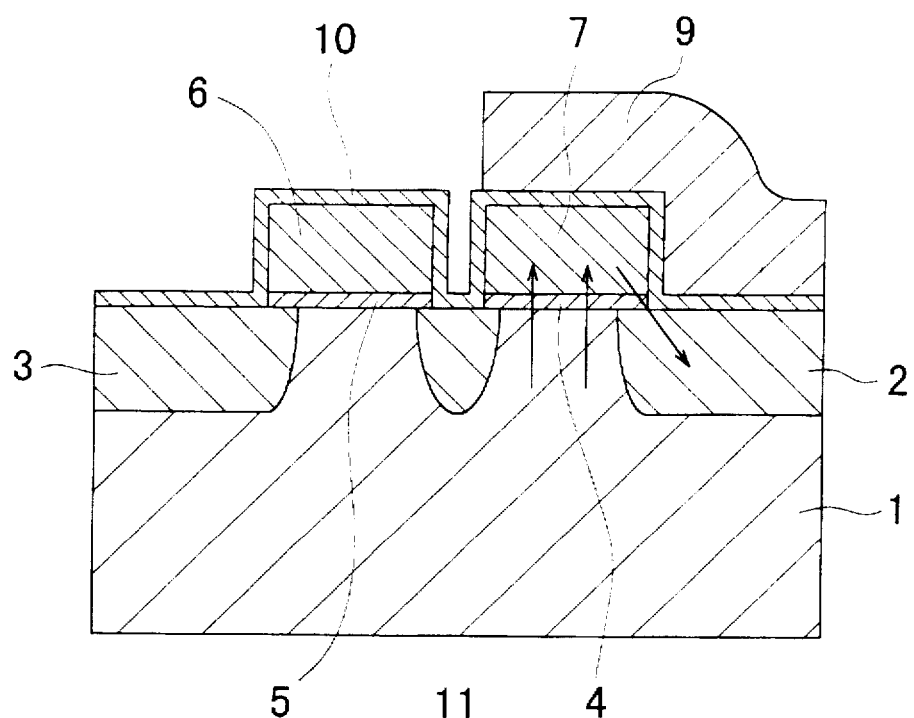
FIG. 14 is a sectional view for showing the structure of a memory cell of a fourth type EEPROM of the third embodiment.

FIGS. 13 and 14 are sectional views for showing the structure of memory cells of third and fourth type EEPROMs of this embodiment, respectively. These EEPROMs can be obtained by forming the control gates 9 merely on the floating-gates 7 in the first and second type EEPROMs, respectively. Therefore, in each of the third and fourth type EEPROMs, even though the control gate 9 is not present on the select gate 6, the control gate 9 can exhibit its own function and the parasitic capacitance between the control gate and the select gate can be decreased. As a result, the reading speed is further increased.

Figure 15:
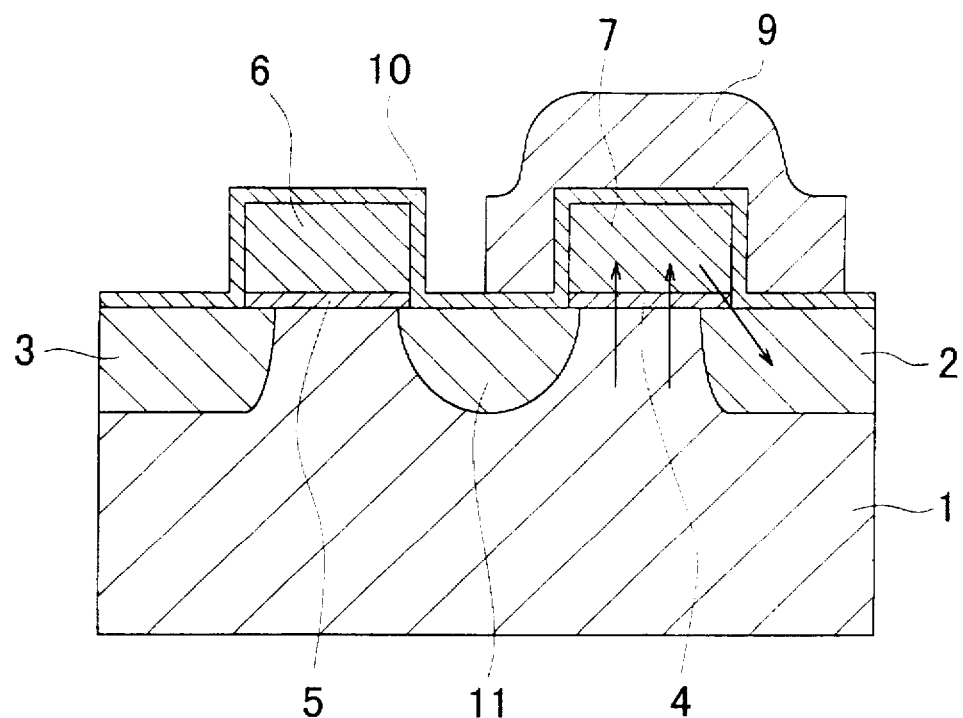
FIG. 15 is a sectional view for showing the structure of a memory cell of a fifth type EEPROM of the third embodiment.

FIG. 15 is a sectional view for showing the structure of a memory cell of a fifth type EEPROM of this embodiment.

In this EEPROM, the distance between a floating-gate 7 and a select gate 6 is increased as compared with that of the fourth type EEPROM, and a control gate 9 covers the top and side surfaces of the floating-gate 7 but is away from the select gate 6. Since the distance between the floating-gate 7 and the select gate 6 is large in this fifth type EEPROM, the control gate is prevented from being too close to the select gate 6 even when alignment shift is caused. Therefore, the parasitic capacitance can be definitely decreased. In addition, since the capacitance between the control gate 9 and the floating-gate 7 is large, the function to inject and extract the electrons into the floating-gate 7 can be advantageously improved.

Figure 16:
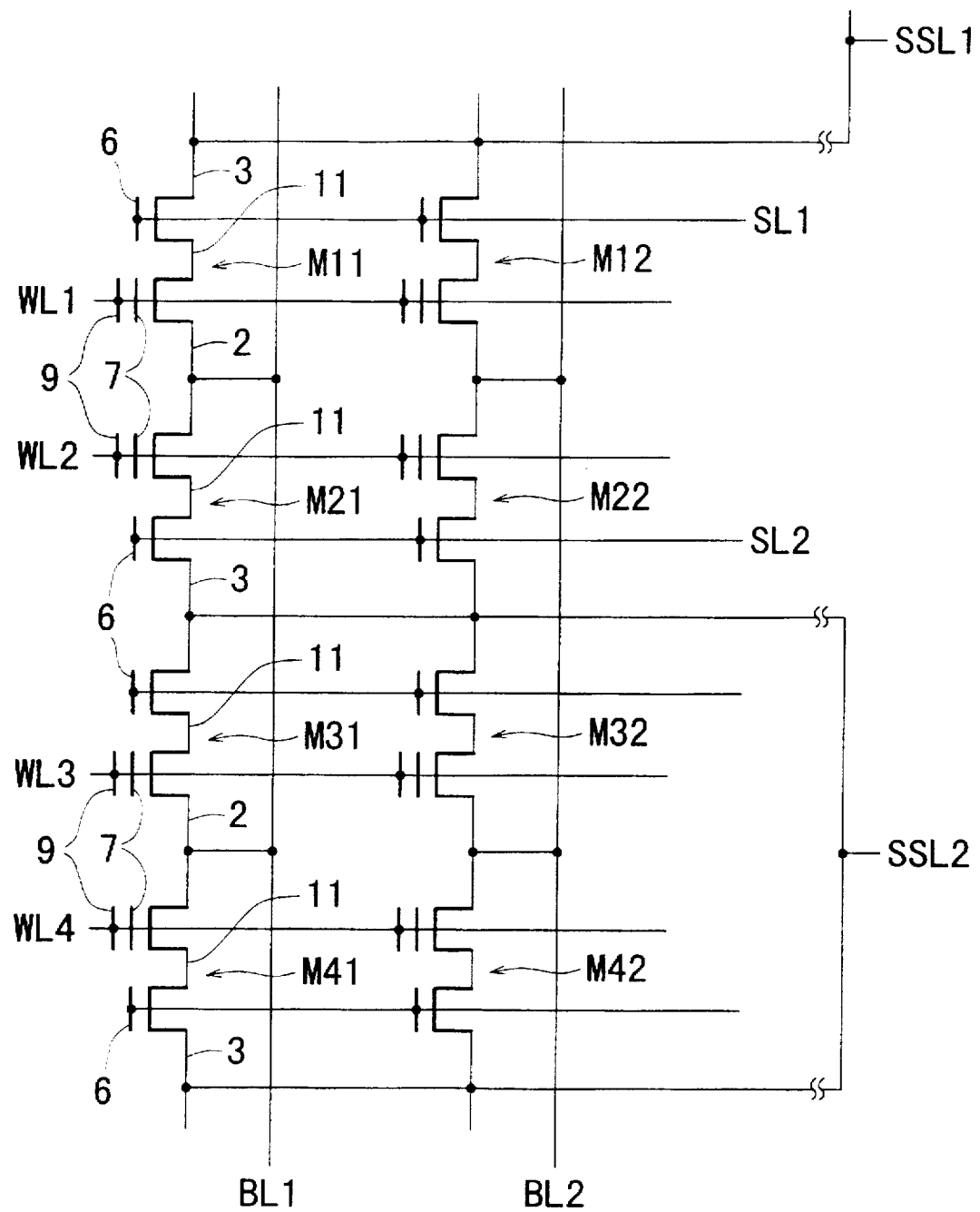
FIG. 16 is an electric circuit diagram of a memory cell array of the EEPROM of the third embodiment.

FIG. 16 is a circuit diagram for partly showing the configuration of a memory cell array in the second, fourth and fifth type EEPROMs of this embodiment. As is shown in FIG. 16, the select transistor and the memory transistor are separated in each memory cell, but this structure is basically the same as that shown in FIG. 2 in that the drain regions of adjacent memory cells are formed as a common drain region and that the source regions of adjacent memory cells are formed as a common source region. Each element of the memory cells shown in FIGS. 11 through 15 is connected in this circuit as follows: The control gates 9 of the respective memory transistors are connected with word lines WL1, WL2, etc. extending along the rows, and the drain region 2 of the adjacent memory cells, for example, of memory cells M11 and M21, is connected with a common bit line BL1 extending along the column. Furthermore, a source line is provided for connection with the source region 3 which commonly belong to memory cells in two rows, and two source lines are combined with each other, so that a combination of four rows corresponding to four word lines is provided with a combined source line SSL1, SSL2, or the like. The select gates 6 of the memory cells disposed in the same row are respectively connected with select lines SL1, SL2, etc. extending along the rows. The diffused layer 11 between the memory transistor and the select transistor is not connected with any signal line.

Now, write and erase operations for, for example, a memory cell M22 will be described referring to FIGS. 17 through 21.

Write Operation (Extraction)

In the write operation, with the respective select lines SL1, SL2, etc. are grounded, the respective source lines SSL1, SSL2, etc. are opened and with the silicon substrate 1 grounded, the potential of the bit line BL2 connected with the drain region of the memory cell M22 to be written is set to be higher than the potential of the word line WL2 connected with the control gate of the memory cell M22, to the extent that an FN tunnel current can flow. Through this setting, the electrons stored in the floating-gate 7 are extracted to the drain region 2, i.e., to the bit line BL2. In this case, the potentials of the word lines, the bit lines, the select lines and the like are set by the following Mode 1 or 2:

(Mode 1)

Figure 17:
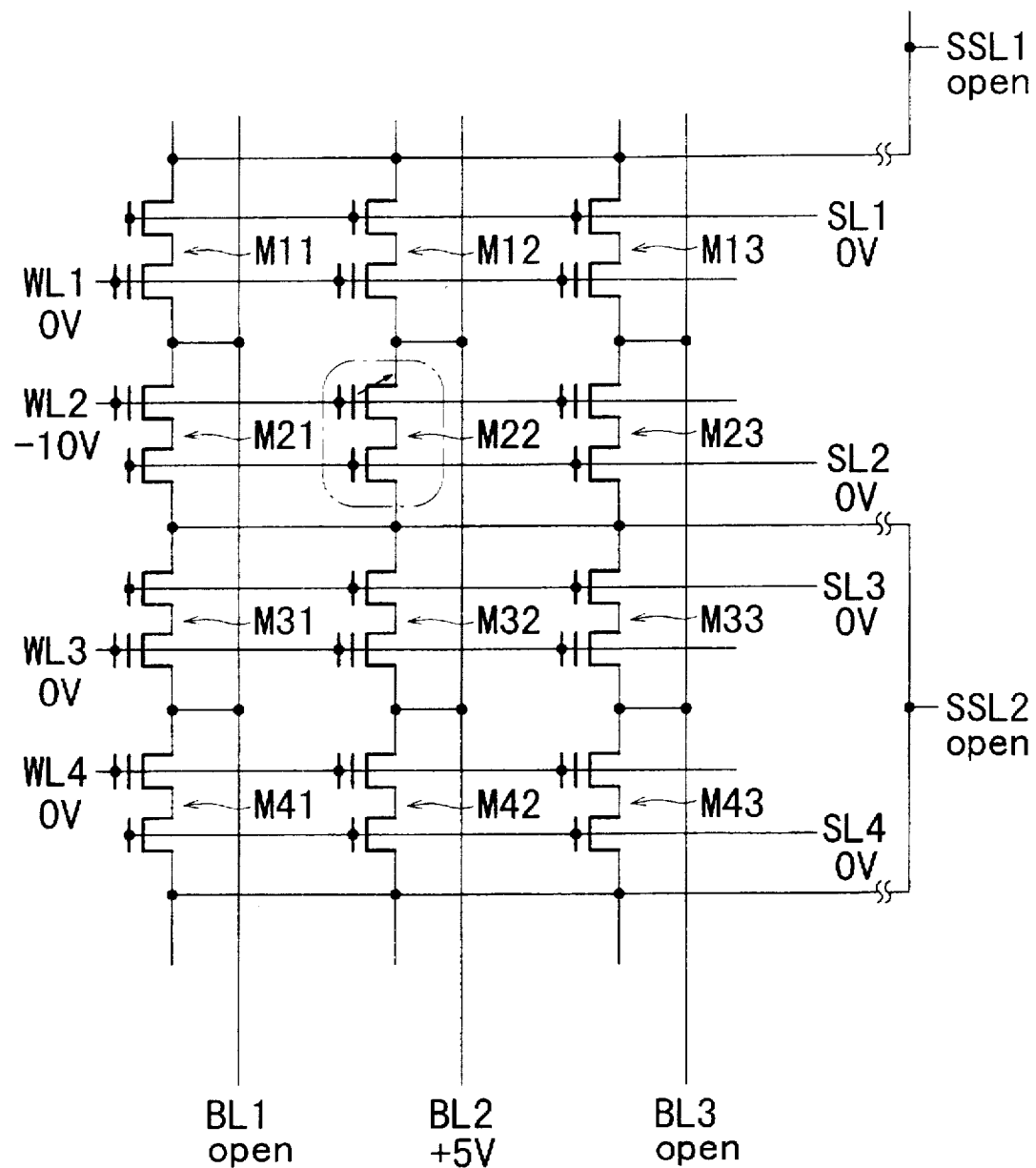
FIG. 17 is an electric circuit diagram for showing the setting of a voltage at each element of the EEPROM of the third embodiment in a write operation by Mode 1.

As is shown in FIG. 17, the potential of the word line WL2 connected with the memory cell M22 to be written is set at −10 V, and the potentials of the other word lines WL1, WL3, WL4, etc. are respectively set at 0 V. The potential of the bit line BL2 connected with the memory cell M22 is set at a positive voltage of 5 V, and the other bit lines BL1, BL3, etc. are opened. All the select lines SL1, SL2, etc. are grounded, and all the source lines SSL1, SSL2, etc. are opened.

(Mode 2)

Figure 18:
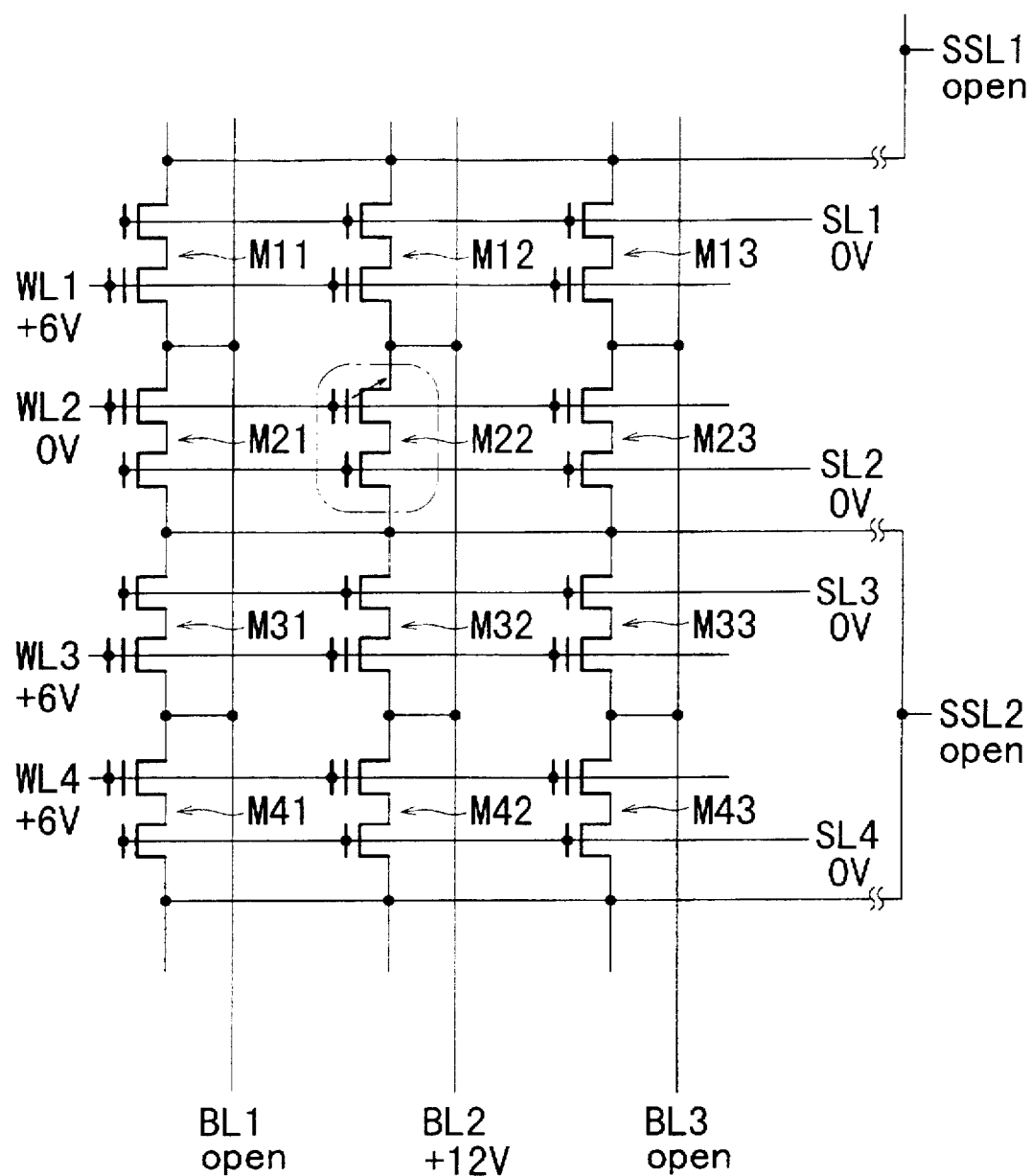
FIG. 18 is an electric circuit diagram for showing the setting of a voltage at each element of the EEPROM of the third embodiment in a write operation by Mode 2.

As is shown in FIG. 18, the word line WL2 connected with the memory cell M22 to be written is grounded, and the potentials of the other word lines WL1, WL3, WL4, etc. are respectively set at 6 V. The potential of the bit line BL2 connected with the memory cell M22 is set at 12 V, and the other bit lines BL1, BL3, BL4, etc. are opened. All the select lines SL1, SL2, etc. are grounded, and all the source lines SSL1, SSL2, etc. are opened.

By setting the potentials in the aforementioned manner, the electrons can be selectively extracted from the floating-gate of merely the memory cell M22 disposed at the intersection of the word line WL2 and the bit line BL2, namely, the memory cell M22 can be placed in a written state.

Erase Operation (Injection)

In the case where all the memory cells commonly connected with at least one word line in the memory cell array are desired to be placed in an erased state, with the potential of that word line set at a positive high voltage and with the potential of the silicon substrate set at a low voltage, the potential difference between the control gate and the silicon substrate is set to be large to the extent that an FN tunnel current can flow. In this manner, in each of the memory cells commonly connected with at least one word line in the memory cell array, the electrons are injected from an area in the silicon substrate between the source and drain regions into the floating-gate through the tunnel insulating film. It is preferred that at least one of the source and drain regions is set at the same potential as the silicon substrate for the above-described reason. In this case, the voltages of the word lines, the silicon substrate, the bit lines and the like are specifically set, for example, by any of the following modes:

(Mode 1)

Figure 19:
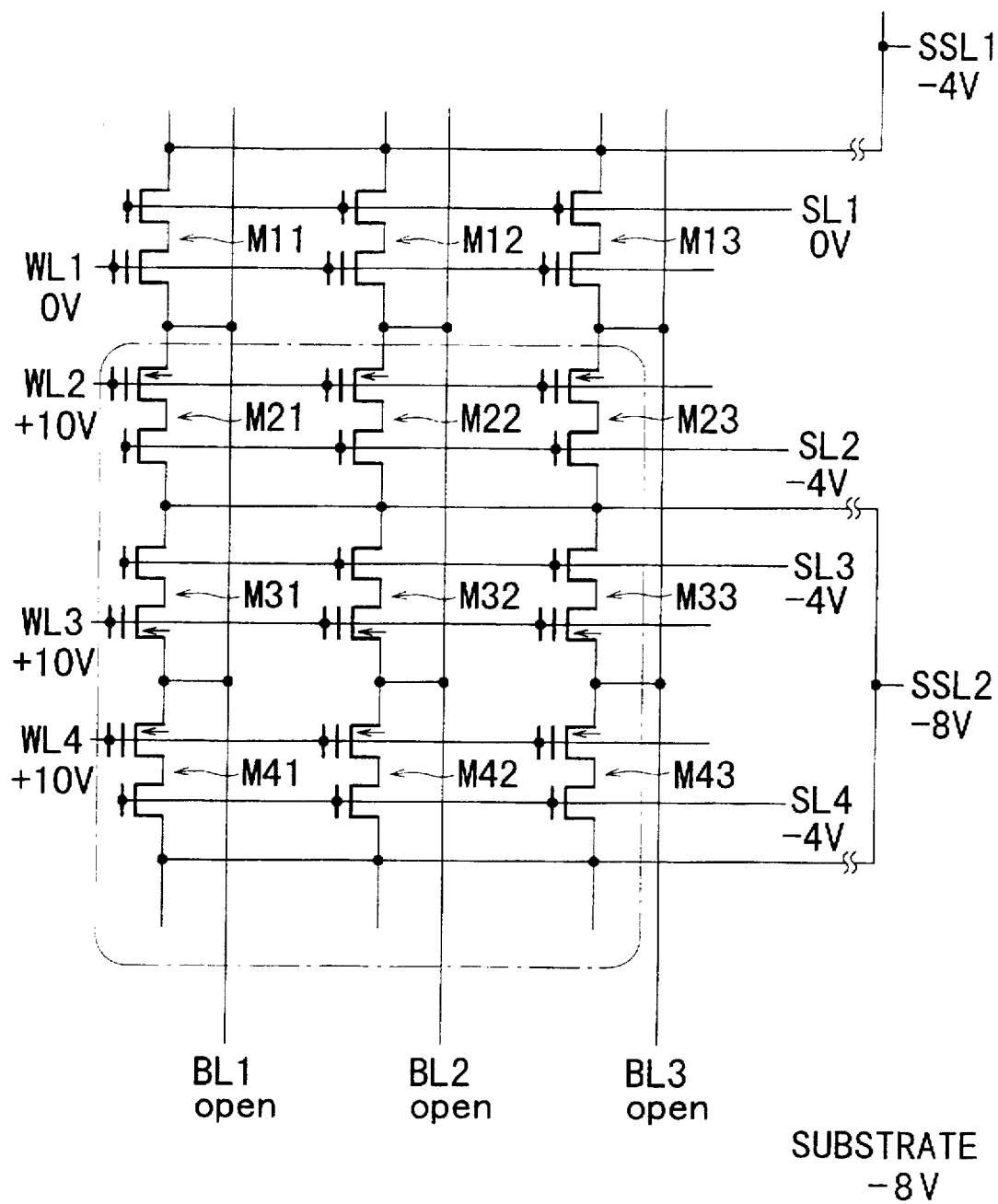
FIG. 19 is an electric circuit diagram for showing the setting of a voltage at each element of the EEPROM of the third embodiment in an erase operation by Mode 1.

As is shown in FIG. 19, the potentials of the word lines WL2 through WL5 (among which the word line WL5 is not shown) are respectively set at approximately 10 V, and the potential of the source line SSL2 corresponding to these four word lines WL2 through WL5 is set at −8 V. The potentials of the select lines SL2 through SL5 (among which the select line SL5 is not shown) corresponding to the four word lines WL2 through WL5 are respectively set at −4 V, and the potentials of the unselected source lines SSL1, etc. are respectively set at −4 V. The potential of the silicon substrate 1 is set at approximately −8 V. The unselected select lines SL1, etc. and the unselected word lines WL1, etc. are grounded, and all the bit lines BL1, BL2, etc. are opened. Through this setting, the electrons are injected at a time into the floating-gates of the memory cells connected with the four word lines WL2 through WL5. In the case where all the memory cells are desired to be placed in an erased state, under the conditions shown in FIG. 19, the potentials of all the word lines WL1, WL2, etc. are respectively set at 10 V, the potentials of all the source lines SSL1, SSL2, etc. are respectively set at −8 V, and the potentials of all the select lines SL1, SL2, etc. are respectively set at −4 V.

By adopting the aforementioned erase operation, each sector of the memory cells commonly connected with any of the 4 word lines WL2, WL3, WL4, WL5, etc. can be placed in an erased state or all the memory cells can be placed in an erased state at a time in this memory cell array. The minimum erasable unit is the number of memory cells connected with 4 word lines.

(Mode 2)

Figure 20:
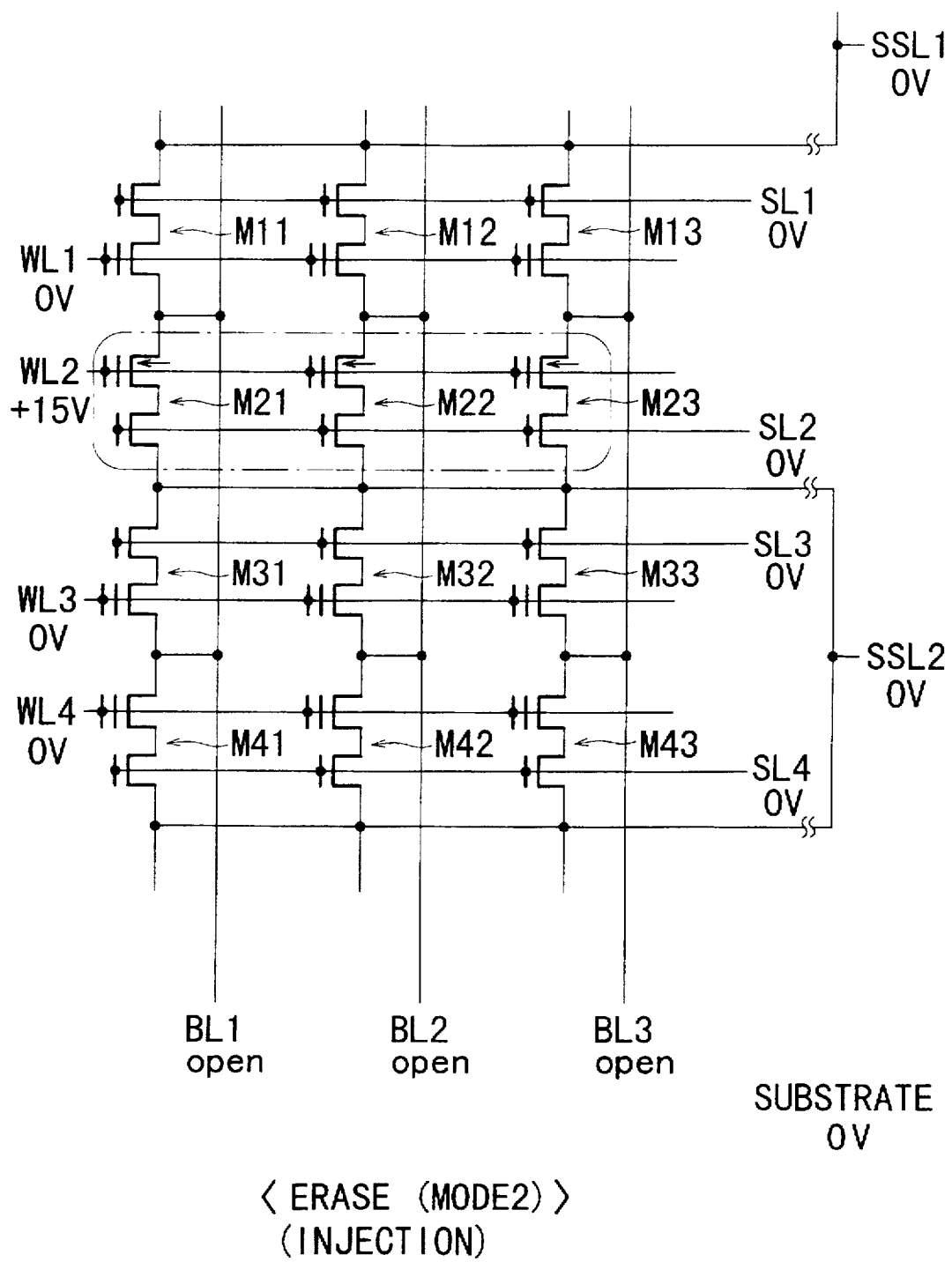
FIG. 20 is an electric circuit diagram for showing the setting of a voltage at each element of the EEPROM of the third embodiment in an erase operation by Mode 2.

As is shown in FIG. 20, the potential of the selected word line WL2 is set at approximately 15 V, the unselected word lines WL1, WL3, WL4, etc. are grounded, and the silicon substrate 1 is also grounded. All the bit lines BL1, BL2, etc. are opened, and all the select lines SL1, SL2, etc. and all the source lines SSL1, SSL2, etc. are grounded. In the case where all the memory cells are desired to be placed in an erased state, under the conditions shown in FIG. 20, the potentials of all the word lines WL1, WL2, etc. are respectively set at 15 V.

By adopting this erase operation, each sector of the memory cells commonly connected with each word line WL1, WL2 or the like can be placed in an erased state or all the memory cells can be placed in an erased state at a time in this memory cell array. The minimum erasable unit is the number of memory cells connected with one word line.

Read Operation

Figure 21:
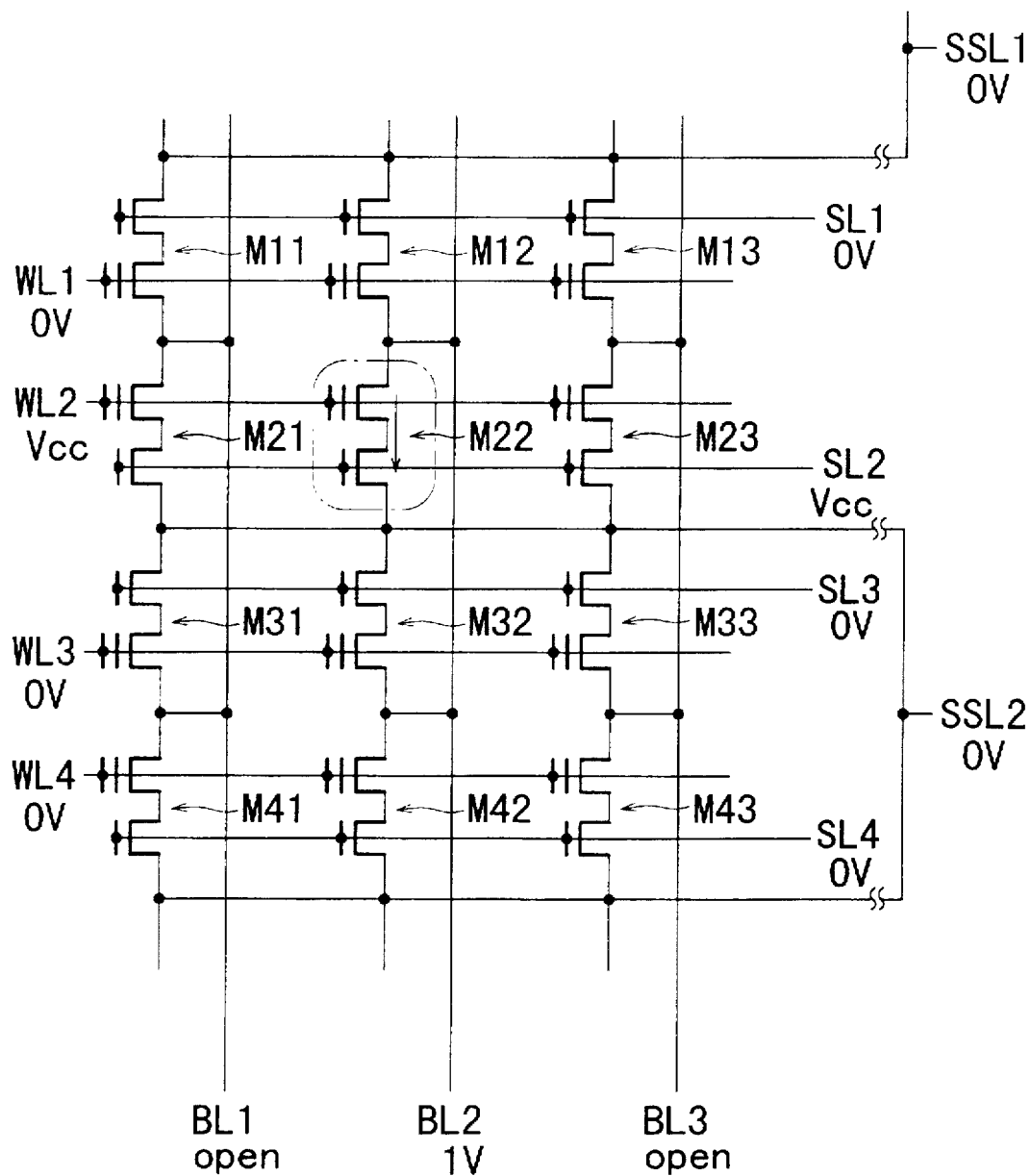
FIG. 21 is an electric circuit diagram for showing the setting of a voltage at each element of the EEPROM of the third embodiment in a read operation.

As is shown in FIG. 21, the potential of the word line WL2 connected with the memory cell M22 to be read is set at the voltage of Vcc, and the other word lines WL1, WL3, WL4, etc. are grounded. The potential of the bit line BL2 connected with the memory cell M22 is set at 1 V, and the other bit lines BL1, BL3, etc. are opened. The potential of the select line SL2 connected with the memory cell M22 is set at the voltage of Vcc, and the other select lines SL1, SL3, SL4, etc. and all the source lines SSL1, SSL2, etc. are grounded.

By setting the potentials in the aforementioned manner, this embodiment can attain basically the same write, erase and read operations as those of Embodiment 1 and can exhibit the same effects.

(Embodiment 4)

Figure 22:
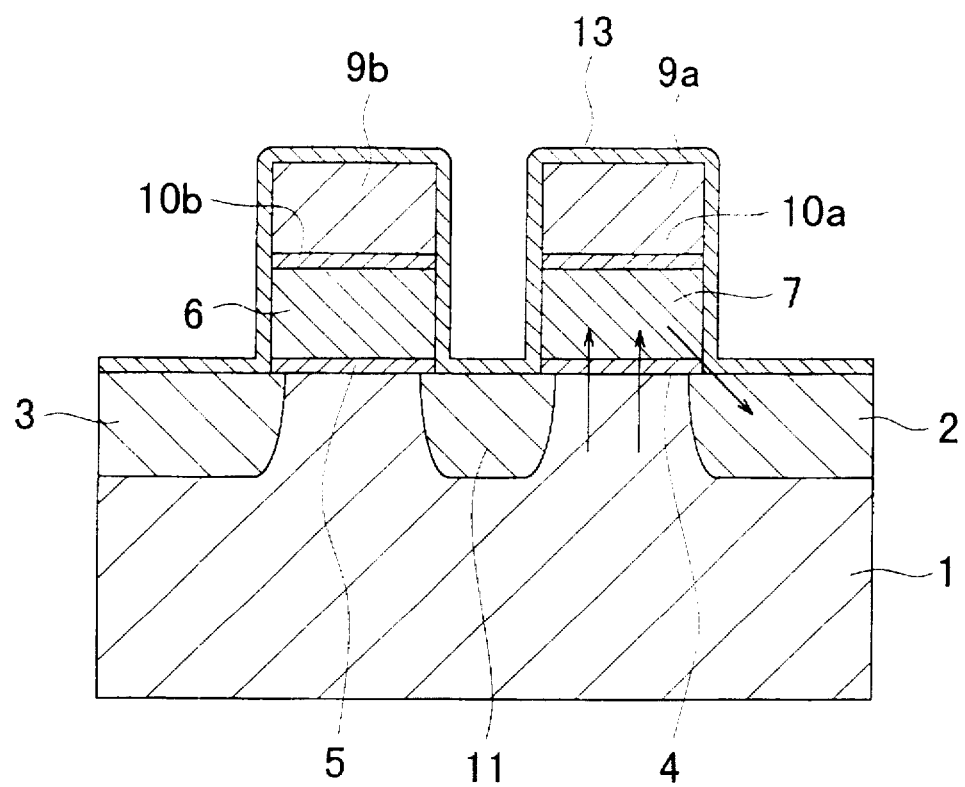
FIG. 22 is a sectional view for showing the structure of a memory cell of an EEPROM of a fourth embodiment.

The fourth embodiment will now be described. FIG. 22 is a sectional view of a memory cell of an EEPROM of this embodiment. As is shown in FIG. 22, this structure is the same as that of the fifth type EEPROM of Embodiment 3 in the following points: A select gate 6 and a floating-gate 7 are formed on a silicon substrate 1 with gate oxide films 5 and 4 sandwiched, respectively; a drain region 2 is formed in the silicon substrate 1 on one side of the floating-gate 7; a source region 3 is formed in the silicon substrate 1 on one side of the select gate 6; and a diffused layer 11 is formed in the silicon substrate 1 between the gates 6 and 7. Differently from the fifth type EEPROM of Embodiment 3, on the floating-gate 7 and the select gate 6 of this embodiment, control gate 9a and a dummy gate 9b are formed with insulating films 10a and 10b sandwiched, respectively. The control gate 9a and the dummy gate 9b are patterned out of a second polysilicon film, and respectively have the same widths as the floating-gate 7 and the select gate 6. The insulating films 10a and 10b are patterned out of the same ONO film. The silicon substrate 1 and the respective gates are covered with an insulating film 13.

Figure 24A:
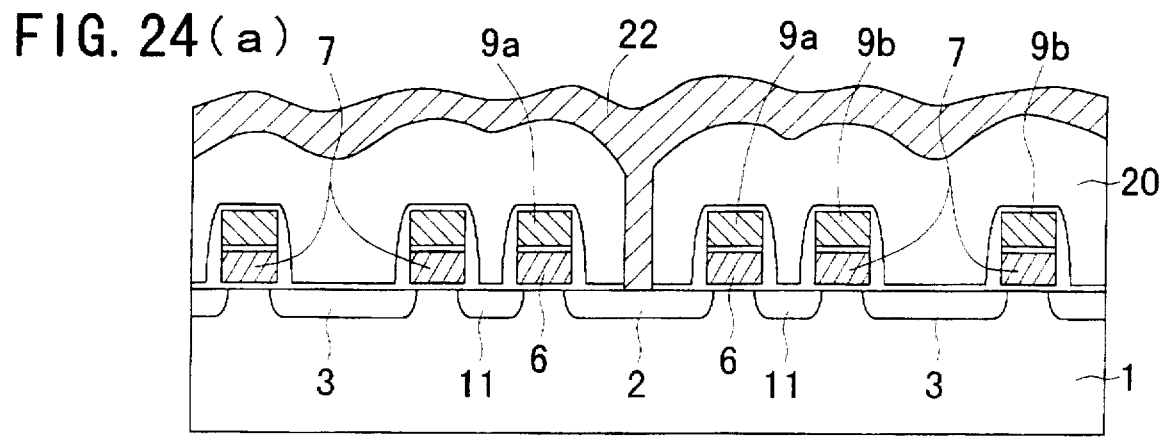
FIGS. 24(a) through 24(c) are sectional views taken on lines XXIVa—XXIVa, XXIVb—XXIVb and XXIVc—XXIVc of FIG. 23, respectively.
Figure 24B:
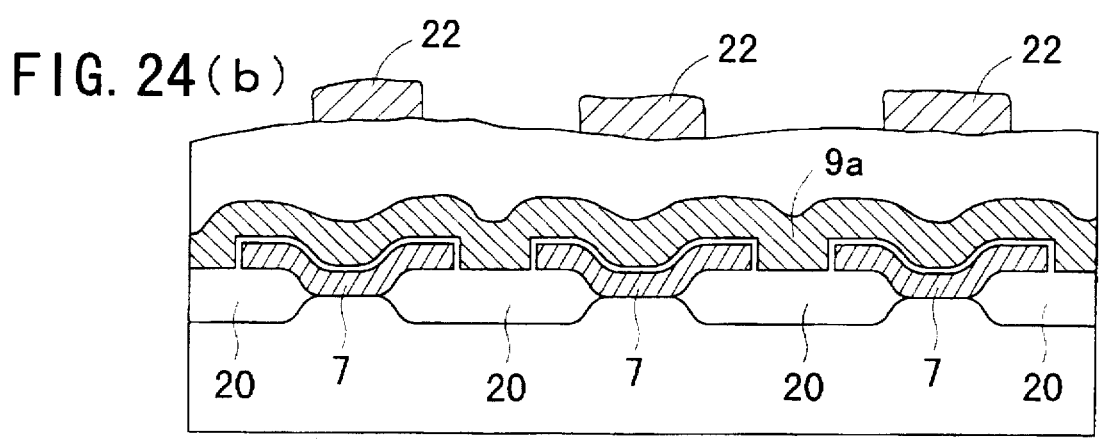
Figure 24C:
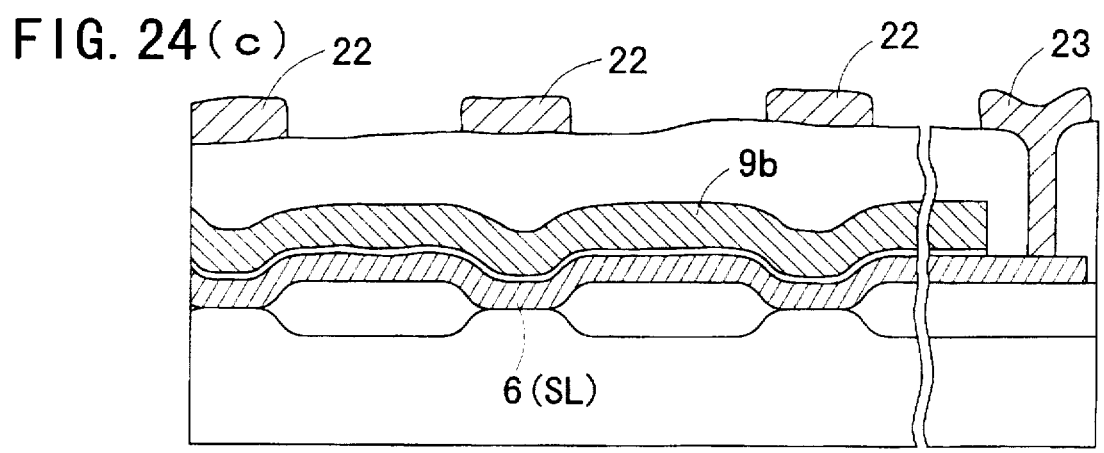
Figure 25A:
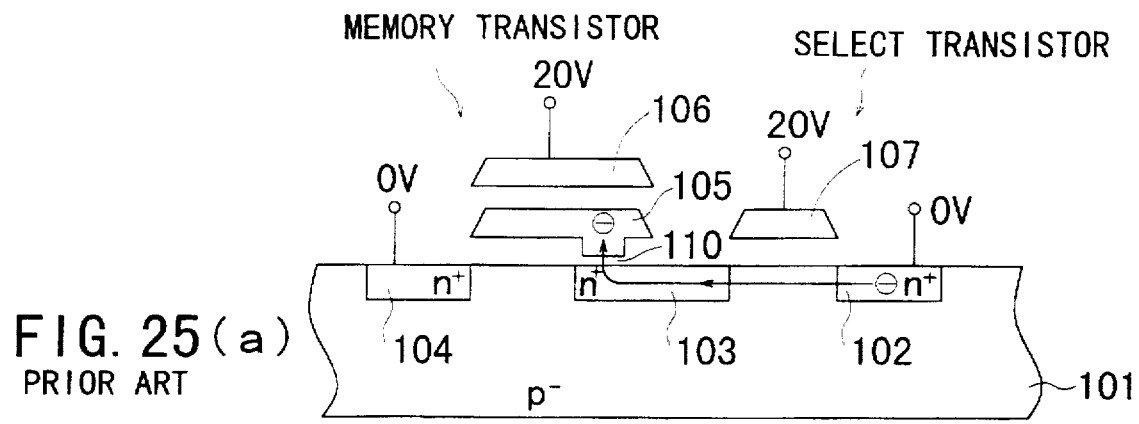
FIGS. 25(a) and 25(b) are sectional views for showing injection and extraction of electrons into and from a floating-gate of a memory cell of a conventional typical EEPROM.
Figure 25B:
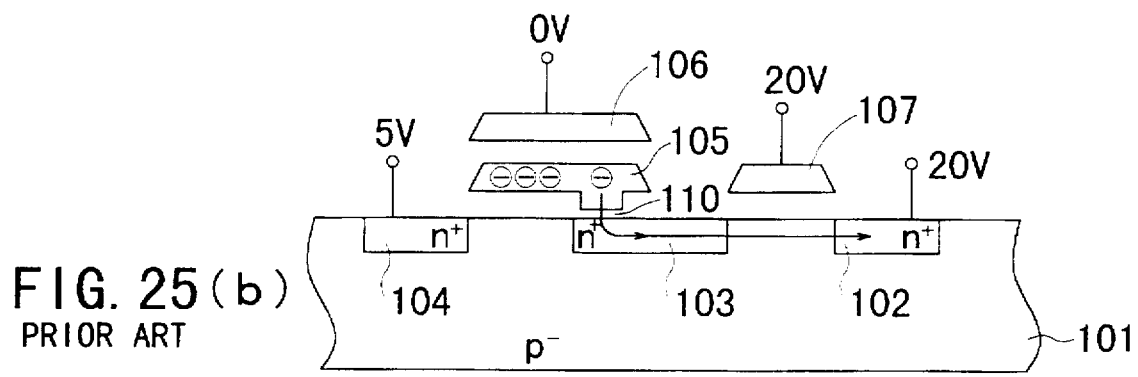
Figure 26:
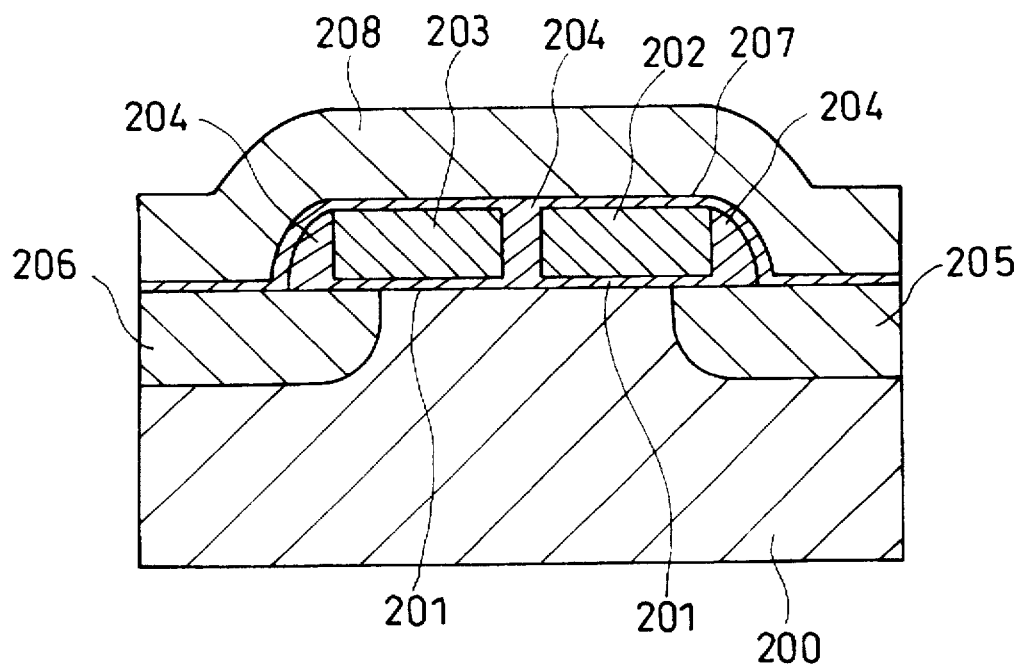
FIG. 26 is a sectional view for showing the structure of a memory cell of an EEPROM utilizing conventional source side injection.

FIG. 23 is a plan view for illustrating the manufacturing process of a memory cell array of the EEPROM of this embodiment, whereas the status shown in FIG. 23 dose not appear during the manufacturing process. FIGS. 24(a) through 24(c) are sectional views taken on lines XXIVa—XXIVa, XXIVb—XXIVb and XXIVc—XXIVc of FIG. 23, respectively. Now, the manufacturing process and the structure of the EEPROM of this embodiment will be described referring to FIGS. 23 and 24(a) through 24(c).

In the manufacturing process, after forming an isolation 20 of a SiO$_2$ film on the silicon substrate 1, a gate oxide film is formed and a first polysilicon film 21 (corresponding to a hatched area in FIG. 23) is formed on the gate oxide film. Then, a portion of the first polysilicon film 21 corresponding to each isolation 20 is selectively removed, thereby forming a rectangular opening 21a. On the first polysilicon film, a second polysilicon film is deposited with an insulating film sandwiched, which procedure is not shown. Furthermore, a portion of the second polysilicon film including an area above the select gate and corresponding to a right end in FIG. 23 is selectively removed, which procedure is also not shown. Thus, as is shown in FIG. 24(c), a gate drawing line 23 can be easily formed from the select gate 6. The second polysilicon film is patterned, thereby forming the control gate 9a and the dummy gate 9b. The first polysilicon film 21 is simultaneously patterned, thereby forming the floating-gate 7 and the select gate 6. At this point, as is shown in FIG. 24(b), due to the opening 21a formed in the first polysilicon film 21, the floating-gate 7 is divided on each isolation 20, so that the floating-gates of the respective memory cells are separated from one another. Then, an interlayer insulating film 24 of a BPSG film or the like is deposited on the entire top surface of the substrate, and contact windows are formed. Then, a metallic film of aluminum or the like is deposited on the entire top surface. The metallic film is patterned, thereby forming a bit line 22 connected with each drain region 2 and the gate drawing line 23 connected with each select gate 6 (See FIGS. 24(a) and 24(c)). A source line connected with each source region 3 is formed on an upper interconnection layer, which is not shown.

Also in this embodiment, the write and erase operations are conducted in the same manner as described in Embodiment 3. In the erase operation, the electrons can be injected into the floating-gate 7 from the area in the silicon substrate 1 between the source and drain regions. Accordingly, this EEPROM can attain basically the same effects as those of Embodiment 3. In addition, since the control gate and the floating-gate are simultaneously formed by using a resist film as a mask, there is no need to provide a margin between the control gate and the floating-gate in consideration of the mask alignment shift differently from the fifth type EEPROM of Embodiment 3 (See FIG. 15), resulting in minimizing each memory cell. Furthermore, since the control gate 9 is not too close to the silicon substrate 1 with the insulating film therebetween differently from the structure of FIG. 15, no large electric field is applied on any part of the insulating film on the silicon substrate 1 in the write and erase operations, resulting in improving the reliability of the device.

Although the dummy gate 9b is present above the select gate 6, there is no difficulty in drawing a signal from the select gate 6 (select line SL) because, as is shown in FIG. 24(c), the gate drawing line 23 connected with the select gate 6 is formed in an area where the second polysilicon film is removed near the edge of the memory cell array.

TABLE 1

| Mode | Extraction Mode 1 | Extraction Mode 2 | Injection Mode 1 | Injection Mode 2 | Read |
|---|---|---|---|---|---|
| Selected Source | open | open | −8 V | 0 V | 0 V |
| Unselected Source | open | open | −4 V | 0 V | 0 V |
| Selected Drain | 5 V | 12 V | open | open | 1 V |
| Unselected Drain | open | open | open | open | open |
| Selected Select gate | 0 V | 0 V | −4 V | 0 V | Vcc |
| Unselected Select gate | 0 V | 0 V | 0 V | 0 V | 0 V |
| Selected Control gate | −10 V | 0 V | 10 V | 15 V | Vcc |
| Unselected Control gate | 0 V | 6 V | 0 V | 0 V | 0 V |
| Substrate | 0 V | 0 V | −8 V | 0 V | 0 V |

What is claimed is:

1. A flash memory comprising at least one memory cell mounted on a semiconductor substrate, said memory cell including:
 a drain region and a source region of a second conductivity type formed in an area of a first conductivity type in said semiconductor substrate with a space between said drain region and said source region;
 a floating-gate formed on said semiconductor substrate to spread over one end of said drain region and an area between said drain and source regions;
 a first insulating film formed between said floating-gate and said semiconductor substrate so as to allow FN tunneling of carriers between said floating-gate and said drain region and between said floating-gate and said area between said drain and source regions;
 a select gate formed on said semiconductor substrate to spread over one end of said source region and said area between said drain and source regions;
 a second insulating film disposed between said select gate and said semiconductor substrate;
 a control gate formed close to at least a part of said floating-gate; and
 a third insulating film disposed between said floating-gate and said control gate,
wherein electrons can be injected due to the FN tunneling from said area between said drain and source regions in said semiconductor substrate into said floating-gate through said first insulating film and extracted due to the FN tunneling from said floating-gate to said drain region through said first insulating film,
wherein said select gate is made of a first conductive film deposited on said semiconductor substrate,
said floating-gate is made of a sidewall formed out of a second conductive film deposited on a side surface of said select gate with a fourth insulating film sandwiched, and
said control gate is made of a third conductive film deposition on said select gate and said floating-gate with said third insulating film sandwiched.

2. The flash memory of claim 1, further comprising:
 a memory cell array including a plurality of said memory cells aligned in a matrix;
 word lines each provided to each row of said memory cells in said memory cell array commonly connected with said control gates of said memory cells disposed in each row in said memory cell array;
 select lines each provided to each row of said memory cells in said memory cell array commonly connected with said select gates of said memory cells disposed in each row in said memory cell array;
 bit lines each provided to each column of said memory cells in said memory cell array commonly connected with said drain regions of said memory cells disposed in each column in said memory cell array; and
 source lines each provided to each row of said memory cells in said memory cell array commonly connected with said source regions of said memory cells disposed in each row in said memory cell array.

3. A flash memory comprising at least one memory cell mounted on a semiconductor substrate, said memory cell including:
 a drain region and a source region of a second conductivity type formed in an area of a first conductivity type in said semiconductor substrate with a space between said drain region and said source region;

19 a floating-gate formed on said semiconductor substrate to spread over one end of said drain region and an are between said drain and source regions;

a first insulating film formed between said floating-gate and said semiconductor substrate so as to allow FN tunneling of carriers between said floating-gate and said drain region and between said floating-gate and said area between said drain and source regions;

a select gate formed on said semiconductor substrate to spread over one end of said source region and said area between said drain and source regions;

a second insulating film disposed between said select gate and said semiconductor substrate;

a control gate formed close to at least a part of said floating-gate; and a third insulating film disposed between said floating-gate and said control gate, wherein electrons can be infected due to the FN tunneling from said area between said drain and source regions in said semiconductor substrate into said floating-gate through said first insulating film and extracted due to the FN tunneling from said floating-gate to said drain region through said first insulating film, and wherein said control gate and said select gate are formed as a common member.

4. The flash memory of claim 3, further comprising:

a memory cell array including a plurality of said memory cells aligned in a matrix;

word lines each provided to each row of said memory cells in said memory cell array commonly connected with said control gates of said memory cells disposed in each row in said memory cell array;

select lines each provided to each row of said memory cells in said memory cell array commonly connected with said select gates of said memory cells disposed in each row in said memory cell array;

bit lines each provided to each column of said memory cells in said memory cell array commonly connected with said drain regions of said memory cells disposed in each column in said memory cell array; and source lines each provided to each row of said memory cells in said memory cell array commonly connected with said source regions of said memory cells disposed in each row in said memory cell array.

5. The flash memory of claim 4, wherein said memory cells in said memory cell array are disposed so that arbitrary two adjacent memory cells in each column have said drain region and said source region in common, and wherein each of said source lines is provided per two rows of said memory cells.

6. A flash memory comprising at least one memory cell mounted on a semiconductor substrate, said memory cell including:

a drain region and a source region of a second conductivity type formed in an area of a first conductivity type in said semiconductor substrate with a space between said drain region and said source region;

a floating-gate formed on said semiconductor substrate to spread over one end of said drain region and an area between said drain and source regions;

a first insulating film formed between said floating-gate and said semiconductor substrate so as to allow FN tunneling of carriers between said floating-gate and said drain region and between said floating-gate and said area between said drain and source regions;

20 a select gate form on said semiconductor substrate to spread over one end of said source region and said area between said drain and source regions;

a second insulating film disposed between said select gate and said semiconductor substrate;

a control rate formed close to at least a part of said floating-gate;

a third insulating film disposed between said floating-gate and said control gate; and an intermediate diffused region formed in an area of said semiconductor substrate between said floating-gate and said select gate, said intermediate diffused region having the same depth and the same impurity concentration as said drain and source regions, wherein electrons can be injected due to the FN tunneling from said area between said drain and source regions in said semiconductor substrate into said floating-gate through said first insulating film and extracted due to the FN tunneling from said floating-gate to said drain region through said first insulating film, said floating-gate and said select gate are both made of a first conductive film deposited above said semiconductor substrate, and said control gate is made of a second conductive film deposited on said first conductive film with said third insulating film sandwiched.

7. The semiconductor storage device of claim 6, wherein a space between said floating-gate and said select gate is filled with said third insulating film and said control gate.

8. The semiconductor storage device of claim 6, wherein said control gate is formed close to said floating-gate alone.

9. The semiconductor storage device of claim 8, wherein said control gate is close to an upper surface and side surfaces of said floating-gate with said third insulating film sandwiched.

10. The semiconductor storage device of claim 8, wherein said control gate has the same width as said floating-gate, a dummy gate having the same width as said select gate is formed above said select gate out of said second conductive film, and a sixth insulating film having the same thickness and made of the same material as said third insulating film is formed between said dummy gate and said select gate.

11. The semiconductor storage device of claim 10, wherein at least one end of said dummy gate is removed.

12. The flash memory of claim 6, further comprising:

a memory cell array including a plurality of said memory cells aligned in a matrix;

word lines each provided to each row of said memory cells in said memory cell array commonly connected with said control gates of said memory cells disposed in each row in said memory cell array;

select lines each provided to each row of said memory cells in said memory cell array commonly connected with said select gates of said memory cells disposed in each row in said memory cell array;

bit lines each provided to each column of said memory cells in said memory cell array commonly connected with said first diffused layers of said memory cells disposed in each column in said memory cell array; and source lines each provided to each row of said memory cells in said memory cell array commonly connected with said second diffused layers of said memory cells disposed in each row in said memory cell array.

13. The semiconductor storage device of claim 12, wherein said memory cells in said memory cell array are disposed so that arbitrary two adjacent memory cells in each column have said first diffused layer and said second diffused layer in common, and each of said source lines is provided per two rows of said memory cells.

14. A method of driving a flash memory, said flash memory comprising a memory cell including a drain region and a source region of a second conductivity type formed in an area of a first conductivity type in a semiconductor substrate with a space therebetween; a floating-gate form on said semiconductor substrate so as to spread over one end of said drain region and an area between said drain and source regions; a first insulating film formed between said floating-gate and said semiconductor substrate so as to allow FN tunneling of carriers between said floating-gate and said drain regions and between said floating-gate and said area between said drain and source regions; a select gate formed on said semiconductor substrate so as to spread over one end of said source region and said area between said drain and source regions; a second insulating film disposed between said select gate and said semiconductor substrate; a control gate formed close to at least a part of said floating-gate; and a third insulating film disposed between said floating-gate and said control gate, wherein, injecting electrons into said floating-gate, said floating-gate is set at a higher potential than said semiconductor substrate, so that the electrons are moved from said area between said drain and source regions in said semiconductor substrate to said floating-gate due to FN tunneling, in extracting electrons, said floating-gate is set at a lower potential than said drain region, so that the electrons are moved from said floating-gate to said drain region due to the FN tunneling, wherein an operation for injecting the electrons into said floating-gate is defined as an erase operation, and an operation for extracting the electrons from said floating-gate is defined as a write operation.

15. The method of driving a semiconductor storage device of claim 14, wherein said semiconductor storage device further comprises a memory cell array including a plurality of said memory cells aligned in a matrix; word lines each provided to each row of said memory cells in said memory cell array commonly connected with said control gates of said memory cells disposed in each row in said memory cell; select lines each provided to each row of said memory cells in said memory cell array commonly connected with said select gates of said memory cells disposed in each row in said memory cell array; bit lines provided to each column of said memory cells in said memory cell array commonly connected with said first diffused layers of said memory cells disposed in each column in said memory cell array; and source lines provided to each row of said memory cells in said memory cell array commonly connected with said second diffused layers of said memory cells disposed in each row in said memory cell array, and in an erase operation, a potential of a selected word line is set at a positive value and unselected word lines are grounded, and a potential of said semiconductor substrate is set at a negative value.

16. The method of driving a semiconductor storage device of claim 15, wherein the erase operation is conducted on a plurality of said word lines at a time.

17. The method of driving a semiconductor storage device of claim 14, wherein said semiconductor storage device further comprises a memory cell array including a plurality of said memory cells aligned in a matrix; word lines each provided to each row of said memory cells in said memory cell array commonly connected with said control gates of said memory cells disposed in each row in said memory cell; select lines each provided to each row of said memory cells in said memory cell array commonly connected with said select gates of said memory cells disposed in each row in said memory cell array; bit lines provided to each column of said memory cells in said memory cell array commonly connected with said first diffused layers of said memory cells disposed in each column in said memory cell array; and source lines provided to each row of said memory cells in said memory cell array commonly connected with said second diffused layers of said memory cells disposed in each row in said memory cell array, and in an erase operation, a potential of a selected word line is set at a large positive value and unselected word lines are grounded, and said semiconductor substrate is grounded.

18. The method of driving a semiconductor storage device of claim 17, wherein the erase operation is conducted on a plurality of said word lines at a time.

19. A flash memory comprising at least one memory cell mounted on a semiconductor substrate, said memory cell including:

a drain region and a source region of a second conductivity type formed in an area of a first conductivity type in said semiconductor substrate with a space between said drain region and said source region;

a floating-gate formed on said semiconductor substrate to spread over one end of said drain region and an area between said drain and source regions;

a first insulating film formed between said floating-gate and said semiconductor substrate so as to allow FN tunneling of carriers between said floating-gate and said drain region and between said floating-gate and said area between said drain and source regions;

a select gate formed on said semiconductor substrate to spread over one end of said source region and said are between said drain and source regions;

a second insulating film disposed between said select gate and said semiconductor substrate;

a control gate formed close to at least a part of said floating-gate; and a third insulating film disposed between said floating-gate and said control gate, wherein electrons can be injected due to the FN tunneling from said area between said drain and source regions in said semiconductor substrate into said floating gate through said first insulating film and extracted due to the FN tunneling from said floating-gate to said drain region through said first insulating film, wherein said floating-gate and said select gate are both made of a first conductive film deposited above said semiconductor substrate, wherein said control gate is made of a second conductive film deposited on said first conductive film with said third insulating film sandwiched, wherein said control gate is formed closed to said floating-gate alone, and has the same width as said floating gate, wherein a dummy gate having the same width as said select gate is formed above said select gate out of said second conductive film, and wherein a sixth insulating film having the same thickness and made of the same material as said third insulating film is formed between said dummy gate and said select gate.

20. The flash memory of claim 19, wherein a space between said floating-gate and said select gate is filled with said third insulating film and said control.

21. The flash memory of claim 19, wherein at least one end of said dummy gate is removed.

22. The flash memory of claim 19, further comprising, a memory cell array including a plurality of said memory cells aligned in a matrix;

word lines each provided to each row of said memory cells in said memory cell array commonly connected with said control gates of said memory cells disposed in each row in said memory cell array;

select lines each provided to each row of said memory cells in said memory cell array commonly connected with said select gates of said memory cells disposed in each row in said memory cell array;

bit lines each provided to each column of said memory cells in said memory cell array commonly connected with said drain regions of said memory cells disposed in each column in said memory cell array; and source lines each provided to each row of said memory cells in said memory cell array commonly connected with said source regions of said memory cells disposed in each row in said memory cell array.

23. The flash memory of claim 22, wherein said memory cells in said memory cell array are disposed so that arbitrary two adjacent memory cells in each column have said drain region and said source region in common, and wherein each of said source lines is provided per two rows of said memory cells.

24. The flash memory of claim 23, wherein said memory cells in said memory cell array are disposed so that arbitrary two adjacent memory cells in each column have said drain region and said source region in common, and wherein each of said source lines is provided per two rows of said memory cells.

* * * * *

UNITED STATES PATENT AND TRADEMARK OFFICE
CERTIFICATE OF CORRECTION

PATENT NO.   :   5,753,953
DATED        :   May 18, 1998
INVENTOR(S)  :   Takahiro Fukumoto It is certified that error appears in the above-identified patent and that said Letters Patent is hereby corrected as shown below:

Col. 19, Line 18:   Change "infected" to read --injected--

Col. 20, Line 6:    Change "rate" to read --gate--

Signed and Sealed this

Fifteenth Day of December, 1998

Attest:

BRUCE LEHMAN

*Attesting Officer*            *Commissioner of Patents and Trademarks*